(12) United States Patent
Hirasawa et al.

(10) Patent No.: US 9,518,215 B2
(45) Date of Patent: *Dec. 13, 2016

(54) LIGHT-EMITTING DEVICE AND LIGHT-EMITTING APPARATUS

(71) Applicant: Panasonic Intellectual Property Management Co., Ltd., Osaka (JP)

(72) Inventors: Taku Hirasawa, Kyoto (JP); Yasuhisa Inada, Osaka (JP); Yoshitaka Nakamura, Osaka (JP); Akira Hashiya, Osaka (JP); Mitsuru Nitta, Osaka (JP); Takeyuki Yamaki, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/618,254

(22) Filed: Feb. 10, 2015

(65) Prior Publication Data

US 2015/0249183 A1    Sep. 3, 2015

(30) Foreign Application Priority Data

Feb. 28, 2014  (JP) ................................. 2014-037992
Jul. 29, 2014  (JP) ................................. 2014-154123

(51) Int. Cl.
*H01L 33/00* (2010.01)
*C09K 11/00* (2006.01)
(Continued)

(52) U.S. Cl.
CPC ............... *C09K 11/00* (2013.01); *H05B 33/14* (2013.01); *C09K 11/7721* (2013.01); *H01L 33/508* (2013.01)

(58) Field of Classification Search
CPC ........... H01L 33/22; H01L 33/10; H01L 33/24
(Continued)

(56) References Cited

U.S. PATENT DOCUMENTS 5,732,102 A  *  3/1998  Bouadma ................ H01S 5/026
                                                                372/50.1
6,728,034 B1     4/2004  Nakanishi et al.
(Continued)

FOREIGN PATENT DOCUMENTS

JP           9-073807 A      3/1997
JP          11-283751 A     10/1999
(Continued)

OTHER PUBLICATIONS

International Search Report of PCT application No. PCT/JP2015/000810 dated Apr. 7, 2015.
(Continued)

*Primary Examiner* — Tuan Nguyen
(74) *Attorney, Agent, or Firm* — McDermott Will & Emery LLP

(57) ABSTRACT

A light-emitting device includes a photoluminescent layer that emits light containing first light, a light-transmissive layer located on or near the photoluminescent layer, and one or more reflectors. A submicron structure is defined on at least one of the photoluminescent layer and the light-transmissive layer. The one or more reflector are located outside the submicron structure. The submicron structure includes at least projections or recesses and satisfies the following relationship:

$$\lambda_a/n_{wav-a} < D_{int} < \lambda_a$$

where $D_{int}$ is a center-to-center distance between adjacent projections or recesses, $\lambda_a$ is the wavelength of the first light
(Continued)

in air, and $n_{wav-a}$ is the refractive index of the photoluminescent layer for the first light.

20 Claims, 23 Drawing Sheets

(51) Int. Cl.
  *H05B 33/14* (2006.01)
  *H01L 33/50* (2010.01)
  *C09K 11/77* (2006.01)
(58) Field of Classification Search
  USPC .......................................................... 257/98
  See application file for complete search history.

(56) References Cited

U.S. PATENT DOCUMENTS

| | | |
|---|---|---|
| 2002/0180348 A1 | 12/2002 | Oda et al. |
| 2003/0021314 A1* | 1/2003 | Yoshida ............. H01S 5/06256 372/45.01 |
| 2003/0169792 A1* | 9/2003 | Kim .................... H01S 5/06256 372/50.11 |
| 2004/0233534 A1 | 11/2004 | Nakanishi et al. |
| 2006/0039433 A1 | 2/2006 | Simpson |
| 2006/0088066 A1* | 4/2006 | He ........................ H01S 5/0265 372/10 |
| 2008/0149916 A1 | 6/2008 | Baba et al. |
| 2008/0258160 A1 | 10/2008 | Do |
| 2009/0021153 A1* | 1/2009 | Lee ........................ B82Y 30/00 313/504 |
| 2009/0190068 A1 | 7/2009 | Kawamura |
| 2009/0206325 A1 | 8/2009 | Biwa et al. |
| 2009/0267092 A1 | 10/2009 | Fukshima et al. |
| 2009/0286337 A1 | 11/2009 | Lee et al. |
| 2010/0142189 A1 | 6/2010 | Hong et al. |
| 2010/0164365 A1 | 7/2010 | Yoshino et al. |
| 2010/0277887 A1 | 11/2010 | Su et al. |
| 2011/0198645 A1 | 8/2011 | Jo et al. |
| 2012/0018705 A1 | 1/2012 | Takazoe et al. |
| 2012/0119638 A1 | 5/2012 | Sato et al. |
| 2012/0176766 A1 | 7/2012 | Natsumeda |
| 2012/0224378 A1 | 9/2012 | Koike et al. |
| 2012/0286258 A1 | 11/2012 | Naraoka et al. |
| 2013/0069046 A1 | 3/2013 | Ishizuya |
| 2013/0208327 A1 | 8/2013 | Bolle et al. |
| 2013/0277703 A1 | 10/2013 | Matsuzaki |
| 2013/0308102 A1 | 11/2013 | Natsumeda et al. |
| 2014/0022818 A1 | 1/2014 | Natsumeda et al. |
| 2014/0071683 A1 | 3/2014 | Hamada et al. |
| 2014/0092620 A1 | 4/2014 | Tissot |
| 2014/0306176 A1 | 10/2014 | Chiu et al. |
| 2014/0362604 A1 | 12/2014 | Masuda |

FOREIGN PATENT DOCUMENTS

| | | |
|---|---|---|
| JP | 2001-059905 A | 3/2001 |
| JP | 2001-155520 A | 6/2001 |
| JP | 2007-103901 A | 4/2007 |
| JP | 2007-240641 A | 9/2007 |
| JP | 2008-130279 A | 6/2008 |
| JP | 2008-521211 A | 6/2008 |
| JP | 2008-227458 A | 9/2008 |
| JP | 2009-140894 A | 6/2009 |
| JP | 2010-015874 A | 1/2010 |
| JP | 2010-033772 A | 2/2010 |
| JP | 2010-199357 A | 9/2010 |
| JP | 2010-210824 A | 9/2010 |
| JP | 2010-231941 | 10/2010 |
| JP | 2011-166148 A | 8/2011 |
| JP | 2012-093454 A | 5/2012 |
| JP | 2012-109334 A | 6/2012 |
| JP | 2012-109400 A | 6/2012 |
| JP | 2012-182376 A | 9/2012 |
| JP | 2013-183020 A | 9/2013 |
| JP | 2014-075584 A | 4/2014 |
| JP | 2014-092645 A | 5/2014 |
| JP | 2014-523603 A | 9/2014 |
| WO | 2007/034827 A1 | 3/2007 |
| WO | 2007/091687 A1 | 8/2007 |
| WO | 2009/099211 A1 | 8/2009 |
| WO | 2011/040528 A1 | 4/2011 |
| WO | 2012/049905 A1 | 4/2012 |
| WO | 2012/108384 A1 | 8/2012 |
| WO | 2012/137584 A1 | 10/2012 |
| WO | 2013/084442 A1 | 6/2013 |
| WO | 2013/125567 A1 | 8/2013 |
| WO | 2013/172025 A1 | 11/2013 |
| WO | 2014/024218 A1 | 2/2014 |
| WO | 2014/119783 A1 | 8/2014 |
| WO | 2015/045886 A1 | 4/2015 |

OTHER PUBLICATIONS

International Search Report of PCT application No. PCT/JP2015/000811 dated Apr. 7, 2015.
International Search Report of PCT application No. PCT/JP2015/000812 dated Apr. 7, 2015.
International Search Report of PCT application No. PCT/JP2015/000813 dated May 19, 2015.
International Search Report of PCT application No. PCT/JP2015/000814 dated May 26, 2015.
International Search Report of PCT application No. PCT/JP2015/000815 dated Apr. 7, 2015.
Non-Final Office Action issued in U.S. Appl. No. 14/618,591, mailed on Nov. 9, 2015.
Non-Final Office Action issued in U.S. Appl. No. 14/621,729, mailed on Mar. 9, 2016.
Final Office Action issued in U.S. Appl. No. 14/621,729, mailed on Sep. 28, 2016.

* cited by examiner

LIGHT-EMITTING DEVICE AND LIGHT-EMITTING APPARATUS

BACKGROUND

1. Technical Field

The present disclosure relates to light-emitting devices and light-emitting apparatuses, and particularly to light-emitting devices and light-emitting apparatuses including a photoluminescent layer.

2. Description of the Related Art

Optical devices, such as lighting fixtures, displays, and projectors, that output light in the necessary direction are required for many applications. Photoluminescent materials, such as those used for fluorescent lamps and white light-emitting diodes (LEDs), emit light in all directions. Thus, those materials are used in combination with optical elements such as reflectors and lenses to output light only in a particular direction.

For example, Japanese Unexamined Patent Application Publication No. 2010-231941 discloses an illumination system including a light distributor and an auxiliary reflector to provide sufficient directionality.

SUMMARY

A light-emitting device according to an embodiment of the present disclosure includes a photoluminescent layer that emits light containing first light, a light-transmissive layer located on or near the photoluminescent layer, and one or more reflectors. A submicron structure is defined on at least one of the photoluminescent layer and the light-transmissive layer. The submicron structure includes at least projections or recesses. The one or more reflectors are located outside the submicron structure. The submicron structure satisfies the following relationship:

$$\lambda_a/n_{wav-a} < D_{int} < \lambda_a$$

where $D_{int}$ is a center-to-center distance between adjacent projections or recesses, $\lambda_a$ is the wavelength of the first light in air, and $n_{wav-a}$ is the refractive index of the photoluminescent layer for the first light.

It should be noted that general or specific embodiments may be implemented as a device, an apparatus, a system, a method, or any elective combination thereof.

BRIEF DESCRIPTION OF THE DRAWINGS

FIG. 17A shows a one-dimensional periodic structure having a period $p_x$ in the x direction, FIG. 17B shows a two-dimensional periodic structure having a period $p_x$ in the x direction and a period $p_y$ in the y direction, FIG. 17C shows the wavelength dependence of light absorptivity in the structure in FIG. 17A, and FIG. 17D shows the wavelength dependence of light absorptivity in the structure in FIG. 17B;

DETAILED DESCRIPTION

Figure 1A:
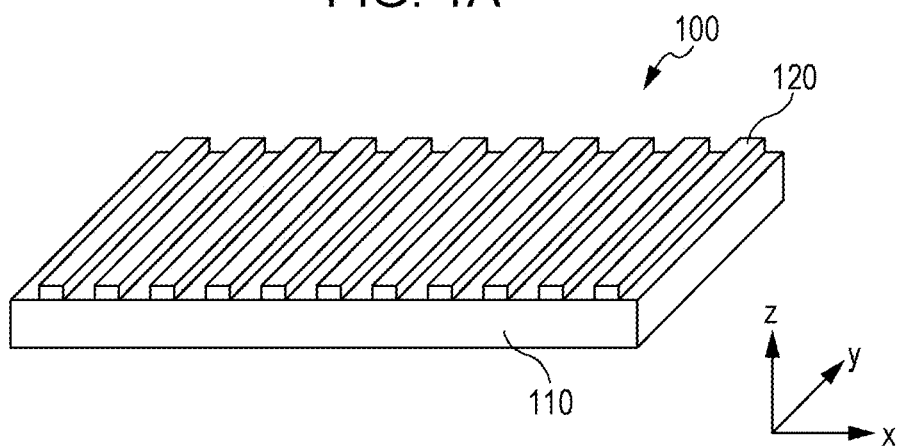
FIG. 1A is a perspective view showing the structure of a light-emitting device according to an embodiment.

Optical devices including optical elements such as reflectors and lenses need to be larger to ensure sufficient space for these optical elements. Accordingly, it is desirable to eliminate or reduce the size of these optical elements.

The present disclosure includes the following light-emitting devices and light-emitting apparatus:

1. A light-emitting device includes a photoluminescent layer that emits light containing first light, and a light-transmissive layer located on or near the photoluminescent layer. A submicron structure is defined on at least one of the photoluminescent layer and the light-transmissive layer. The submicron structure may extend in a plane of the photoluminescent layer or the light-transmissive layer. The submicron structure includes at least projections or recesses and satisfies the following relationship:

$$\lambda_a/n_{wav-a} < D_{int} < \lambda_a$$

where $D_{int}$ is the center-to-center distance between adjacent projections or recesses, $\lambda_a$ is the wavelength of the first light in air, and $n_{wav-a}$ is the refractive index of the photoluminescent layer for the first light. The wavelength $\lambda_a$ is, for example, within the visible wavelength range (e.g., 380 to 780 nm).

In general, the light emitted from the photoluminescent layer is light in a wavelength range including the peak wavelength. The wavelength $\lambda_a$ of the first light need not be the peak wavelength, but may be any wavelength within the emission wavelength range. If the first light is light of a wavelength other than the peak wavelength, light weaker than light of the peak wavelength can be enhanced. Thus, the emission spectrum of the light-emitting device can be changed to output the desired light without changing the material for the photoluminescent layer.

2. In Item 1, the submicron structure may include at least one periodic structure defined by at least the projections or recesses, and the at least one periodic structure may include a first periodic structure satisfying the following relationship:

$$\lambda_a/n_{wav-a} < p_a < \lambda_a$$

where $p_a$ is the period of the first periodic structure.

3. In Item 1 or 2, the refractive index $n_{t-a}$ of the light-transmissive layer for the first light may be lower than the refractive index $n_{wav-a}$ of the photoluminescent layer for the first light.

4. In any one of Items 1 to 3, the first light may have the maximum intensity in a first direction determined in advance by the submicron structure.

5. In Item 4, the first direction may be normal to the photoluminescent layer.

6. In Item 4 or 5, the first light output in the first direction may be linearly polarized light.

7. In any one of Items 4 to 6, the angle of directionality of the first light with respect to the first direction may be less than 15°.

8. In any one of Items 4 to 7, second light having a wavelength $\lambda_b$ different from the wavelength $\lambda_a$ of the first light may have the maximum intensity in a second direction different from the first direction.

9. In any one of Items 1 to 8, the light-transmissive layer may have the submicron structure.

10. In any one of Items 1 to 9, the photoluminescent layer may have the submicron structure.

11. In any one of Items 1 to 8, the photoluminescent layer may have a flat main surface, and the light-transmissive layer may be located on the flat main surface of the photoluminescent layer and may have the submicron structure.

12. In Item 11, the light-emitting device may further include a transparent substrate that supports the photoluminescent layer.

13. In any one of Items 1 to 8, the light-transmissive layer may be a transparent substrate having the submicron structure on a main surface thereof, and the photoluminescent layer may be located on the submicron structure.

14. In Item 1 or 2, the refractive index $n_{t-a}$ of the light-transmissive layer for the first light may be higher than or equal to the refractive index $n_{wav-a}$ of the photoluminescent layer for the first light, and each of the projections or recesses in the submicron structure may have a height or depth of 150 nm or less.

15. In any one of Items 1 and 3 to 14, the submicron structure may include at least one periodic structure defined by at least the projections or recesses, and the at least one periodic structure may include a first periodic structure satisfying the following relationship:

$$\lambda_a/n_{wav-a} < p_a < \lambda_a$$

where $p_a$ is the period of the first periodic structure. The first periodic structure may be a one-dimensional periodic structure.

16. In Item 15, the light emitted from the photoluminescent layer may contain second light having a wavelength $\lambda_b$ different from the wavelength $\lambda_a$ in air, and the at least one periodic structure may further include a second periodic structure satisfying the following relationship:

$$\lambda_b/n_{wav-b} < p_b < \lambda_b$$

where $n_{wav-b}$ is the refractive index of the photoluminescent layer for the second light, and $p_b$ is the period of the second periodic structure. The second periodic structure may be a one-dimensional periodic structure.

17. In any one of Items 1 and 3 to 14, the submicron structure may include at least two periodic structures defined by at least the projections or recesses, and the at least two periodic structures may include a two-dimensional periodic structure having periodicity in different directions.

18. In any one of Items 1 and 3 to 14, the submicron structure may include periodic structures defined by at least the projections or recesses, and the periodic structures may include periodic structures arranged in a matrix.

19. In any one of Items 1 and 3 to 14, the submicron structure may include periodic structures defined by at least the projections or recesses, and the periodic structures may include a periodic structure satisfying the following relationship:

$$\lambda_{ex}/n_{wav-ex} < p_{ex} < \lambda_{ex}$$

where $p_{ex}$ is the period of the periodic structure, $\lambda_{ex}$ is the wavelength, in air, of excitation light for a photoluminescent material contained in the photoluminescent layer, and $n_{wav-ex}$ is the refractive index of the photoluminescent layer for the excitation light.

20. A light-emitting device includes photoluminescent layers and light-transmissive layers. At least two of the photoluminescent layers are each independently the photoluminescent layer according to any one of Items 1 to 19, and at least two of the light-transmissive layers are each independently the light-transmissive layer according to any one of Items 1 to 19.

21. In Item 20, the photoluminescent layers and the light-transmissive layers may be stacked on top of each other.

22. A light-emitting device includes a photoluminescent layer, and a light-transmissive layer located on or near the photoluminescent layer. A submicron structure defined on at least one of the photoluminescent layer and the light-transmissive layer. The submicron structure may extend in a plane of the photoluminescent layer or the light-transmissive layer. Light is directed into the photoluminescent layer and the light-transmissive layer to form a quasi-guided mode.

23. A light-emitting device includes a waveguide layer capable of guiding light and a periodic structure located on or near the waveguide layer. The waveguide layer contains a photoluminescent material. The waveguide layer forms a quasi-guided mode in which light emitted from the photoluminescent material is guided while interacting with the periodic structure.

24. A light-emitting apparatus includes the light-emitting device according to any one of Items 1 to 23 and an excitation light source that irradiates the photoluminescent layer with excitation light.

25. A light-emitting device includes a photoluminescent layer, and a light-transmissive layer located on or near the photoluminescent layer. A submicron structure is defined on at least one of the photoluminescent layer and the light-transmissive layer. The submicron structure may extend in a plane of the photoluminescent layer or the light-transmissive layer. The submicron structure includes projections or recesses and satisfies the following relationship:

$$\lambda_{ex}/n_{wav-ex} < D_{int} < \lambda_{ex}$$

where $D_{int}$ is the center-to-center distance between adjacent projections or recesses, $\lambda_{ex}$ is the wavelength, in air, of excitation light for a photoluminescent material contained in the photoluminescent layer, and $n_{wav-ex}$ is the refractive index, for the excitation light, of a medium having the highest refractive index of media present in an optical path to the photoluminescent layer or the light-transmissive layer.

26. In Item 25, the submicron structure may include at least one periodic structure defined by at least the projections or recesses, and the at least one periodic structure may include a first periodic structure satisfying the following relationship:

$$\lambda_{ex}/n_{wav-ex} < p_{ex} < \lambda_{ex}$$

where $p_{ex}$ is the period of the first periodic structure.

27. A light-emitting device includes a photoluminescent layer that emits light containing first light, a light-transmissive layer located on or near the photoluminescent layer, and one or more reflectors. A submicron structure is defined on at least one of the photoluminescent layer and the light-transmissive layer. The submicron structure may extend in a plane of the photoluminescent layer or the light-transmissive layer. The one or more reflectors are located outside the submicron structure. The submicron structure includes projections or recesses and satisfies the following relationship:

$$\lambda_a/n_{wav-a} < D_{int} < \lambda_a$$

where $D_{int}$ is the center-to-center distance between adjacent projections or recesses, $\lambda_a$ is the wavelength of the first light in air, and $n_{wav-a}$ is the refractive index of the photoluminescent layer for the first light.

28. In Item 27, the one or more reflectors may include at least one reflector comprising a distributed Bragg reflector (DBR).

29. In Item 28, the submicron structure may include a periodic structure defined by at least the projections or recesses, and the distributed Bragg reflector may include a diffraction grating defined by at least projections or recesses. The diffraction grating of the distributed Bragg reflector may be located substantially in the same plane as the periodic structure.

30. In Item 29, the periodic structure of the submicron structure may have a first period, and the diffraction grating of the distributed Bragg reflector may have a second period that is one-half the first period.

31. In Item 29 or 30, the light-emitting device may further include a phase-matching element between the submicron structure and the distributed Bragg reflector.

32. In Item 31, the periodic structure may have a first period, and the phase-matching element may have a length that is one-eighth the first period in the plane.

33. In Item 27, the one or more reflectors may include at least one reflector comprising a reflective metal surface located in an end surface of the photoluminescent layer.

34. In Item 33, the light-emitting device may further include a phase-matching element between the submicron structure and the reflective metal surface.

35. In any one of Items 27 to 34, the one or more reflectors include at least one pair of reflectors that are arranged in a direction of a periodic pattern of the submicron structure in such a way that the submicron structure is located between the pair of reflectors.

36. A light-emitting apparatus includes the light-emitting device according to any one of Items 27 to 35; and a light source that directs excitation light into the light-emitting device.

37. A light-emitting device includes a photoluminescent layer that emits light containing first light, a light-transmissive layer having a higher refractive index than the photoluminescent layer; and one or more reflectors. A submicron structure is defined on the light-transmissive layer. The submicron structure comprising at least projections or recesses. The one or more reflectors are located outside the submicron structure. The submicron structure includes at least one periodic structure defined by at least the projections or recesses, and the at least one periodic structure includes a first periodic structure satisfying the following relationship:

$$\lambda_a/n_{wav-a} < p_a < \lambda_a$$

where $p_a$ is the period of the first periodic structure, $\lambda_a$ is the wavelength of the first light in air, and $n_{wav-a}$ is the refractive index of the photoluminescent layer for the first light.

38. In Item 37, a distance between the submicron structure and the photoluminescent layer may be more than $\lambda_a/2$.

39. A light-emitting device includes a light-transmissive layer on which a submicron structure is defined; a photoluminescent layer that is located on or near the submicron structure and emits light containing first light; and one or more reflectors located outside the submicron structure. The submicron structure comprises at least projections or recesses, and the submicron structure includes at least one periodic structure defined by at least the projections or recesses. The at least one periodic structure includes a first periodic structure satisfying the following relationship:

$$\lambda_a/n_{wav-a} < p_a < \lambda_a$$

where $p_a$ is the period of the first periodic structure, $\lambda_a$ is the wavelength of the first light in air, and $n_{wav-a}$ is the refractive index of the photoluminescent layer for the first light.

40. A light-emitting device includes a photoluminescent layer that emits light containing first light; and one or more reflectors. A submicron structure is defined on the photoluminescent layer, the submicron structure comprising at least projections or recesses. The one or more reflectors are located outside the submicron structure. The submicron structure includes at least one periodic structure defined by at least the projections or recesses, and the at least one periodic structure includes a first periodic structure satisfying the following relationship:

$$\lambda_a/n_{wav-a} < p_a < \lambda_a$$

where $p_a$ is the period of the first periodic structure, $\lambda_a$ is the wavelength of the first light in air, and $n_{wav-a}$ is the refractive index of the photoluminescent layer for the first light.

A light-emitting device according to an embodiment of the present disclosure includes a photoluminescent layer that emits light containing first light, and a light-transmissive layer located on or near the photoluminescent layer. A submicron substructure is defined on at least one of the photoluminescent layer and the light-transmissive layer. The submicron structure may extend in a plane of the photoluminescent layer or the light-transmissive layer. The submicron structure includes at least projections or recesses. The submicron structure satisfies the following relationship:

$$\lambda_a/n_{wav-a} < D_{int} < \lambda_a$$

where $D_{int}$ is the center-to-center distance between adjacent projections or recesses, $\lambda_a$ is the wavelength of the first light in air, and $n_{wav-a}$ is the refractive index of the photoluminescent layer for the first light. The wavelength $\lambda_a$ is, for example, within the visible wavelength range (e.g., 380 to 780 nm).

The photoluminescent layer contains a photoluminescent material. The term "photoluminescent material" refers to a material that emits light in response to excitation light. This term encompasses fluorescent materials and phosphorescent materials in a narrow sense, encompasses inorganic materials and organic materials (e.g., dyes), and encompasses quantum dots (i.e., tiny semiconductor particles). The photoluminescent layer may contain a matrix material (host material) in addition to the photoluminescent material. Examples of matrix materials include resins and inorganic materials such as glasses and oxides.

The light-transmissive layer located on or near the photoluminescent layer is made of a material with high transmittance to the light emitted from the photoluminescent layer. Examples of such materials include inorganic materials and resins. For example, the light-transmissive layer is desirably made of a dielectric (particularly, an insulator with low light absorption). For example, the light-transmissive layer may be a substrate that supports the photoluminescent layer. Alternatively, if the surface of the photoluminescent layer facing air has the submicron structure, the air layer can serve as the light-transmissive layer.

In the light-emitting device according to the embodiment of the present disclosure, the submicron structure (e.g., a periodic structure) defined on at least one of the photoluminescent layer and the light-transmissive layer forms a unique electric field distribution inside the photoluminescent layer and the light-transmissive layer, as described in detail later with reference to the results of calculations and experiments. This electric field distribution, also termed "quasi-guided mode", is due to the interaction of guided light with the submicron structure. The quasi-guided mode can be utilized to improve the luminous efficiency, directionality, and polarization selectivity of photoluminescence, as described later. Although the term "quasi-guided mode" is used in the following description to describe novel structures and/or mechanisms contemplated by the inventors, this description is for illustrative purposes only and is not intended to limit the present disclosure in any way.

For example, the submicron structure includes projections and satisfies the relationship $\lambda_a/n_{wav-a} < D_{int} < \lambda_a$, where $D_{int}$ is the center-to-center distance between adjacent projections. Instead of the projections, the submicron structure may include recesses. For simplicity, the following description will be directed to a submicron structure including projections. The symbol λ is the wavelength of light, and the symbol $\lambda_a$ is the wavelength of light in air. The symbol $n_{wav}$ is the refractive index of the photoluminescent layer. If the photoluminescent layer is a medium containing materials, the refractive index $n_{wav}$ is the average refractive index of the materials weighted by their respective volume fractions. Although it is preferable to use the symbol $n_{wav-a}$ to refer to the refractive index of the photoluminescent layer for light of the wavelength $\lambda_a$ because the refractive index n generally depends on the wavelength, it may be abbreviated for simplicity. The symbol $n_{wav}$ is basically the refractive index of the photoluminescent layer; however, if a layer having a higher refractive index than the photoluminescent layer is adjacent to the photoluminescent layer, the refractive index $n_{wav}$ is the average refractive index of the layer having a higher refractive index and the photoluminescent layer weighted by their respective volume fractions. This is optically equivalent to a photoluminescent layer composed of layers of different materials.

The effective refractive index $n_{eff}$ of the medium for light in the quasi-guided mode satisfies $n_a < n_{eff} < n_{wav}$, where $n_a$ is the refractive index of air. If light in the quasi-guided mode is assumed to be light propagating through the photoluminescent layer while being totally reflected at an angle of incidence θ, the effective refractive index $n_{eff}$ can be written as $n_{eff} = n_{wav} \sin θ$. The effective refractive index $n_{eff}$ is determined by the refractive index of the medium present in the region where the electric field of the quasi-guided mode is distributed. For example, if the submicron structure is defined by the light-transmissive layer, the effective refractive index $n_{eff}$ depends not only on the refractive index of the photoluminescent layer, but also on the refractive index of the light-transmissive layer. Because the electric field distribution also varies depending on the polarization direction of the quasi-guided mode (i.e., the TE mode or the TM mode), the effective refractive index $n_{eff}$ can differ between the TE mode and the TM mode.

The submicron structure is defined on at least one of the photoluminescent layer and the light-transmissive layer. If the photoluminescent layer and the light-transmissive layer are in contact with each other, the submicron structure may be defined on the interface between the photoluminescent layer and the light-transmissive layer. In this case, the photoluminescent layer and the light-transmissive layer have the submicron structure. Alternatively, the light-transmissive layer located on or near the photoluminescent layer may have the submicron structure without the photoluminescent layer having the submicron structure. When the submicron structure of the light-transmissive layer is said to be near the photoluminescent layer, or one layer is said to be near another layer, the distance therebetween is typically half the wavelength $\lambda_a$ or less. This allows the electric field of a guided mode to reach the submicron structure, thus forming a quasi-guided mode. However, the distance between the submicron structure of the light-transmissive layer and the photoluminescent layer may exceed half the wavelength $\lambda_a$ if the light-transmissive layer has a higher refractive index than the photoluminescent layer. If the light-transmissive layer has a higher refractive index than the photoluminescent layer, light reaches the light-transmissive layer even if the above relationship is not satisfied.

The submicron structure, which satisfies the relationship $\lambda_a/n_{wav-a} < D_{int} < \lambda_a$ as described above, is characterized by a submicron size. The submicron structure includes, for example, at least one periodic structure, as in the light-emitting devices according to the embodiments described in detail later. The at least one periodic structure satisfies the relationship $\lambda_a/n_{wav-a} < p_a < \lambda_a$, where $p_a$ is the period of the at least one periodic structure. That is, the submicron structure includes a periodic structure in which the center-to-center distance $D_{int}$ between adjacent projections is constant at $p_a$. If the submicron structure includes such a periodic structure, light in the quasi-guided mode propagates while repeatedly interacting with the periodic structure so that the light is diffracted by the submicron structure. Unlike the phenomenon in which light propagating through free space is diffracted by a periodic structure, this is the phenomenon in which light is guided (i.e., repeatedly totally reflected) while interacting with the periodic structure. This efficiently diffracts the light even if the periodic structure causes a small phase shift (i.e., even if the periodic structure has a small height).

The above mechanism can be utilized to improve the luminous efficiency of photoluminescence by the enhancement of the electric field due to the quasi-guided mode and also to couple the emitted light into the quasi-guided mode. The angle of travel of the light in the quasi-guided mode is varied by the angle of diffraction determined by the periodic structure. This can be utilized to output light of a particular wavelength in a particular direction (i.e., significantly improve the directionality). Furthermore, high polarization selectivity can be simultaneously achieved because the effective refractive index $n_{eff}$ ($=n_{wav} \sin θ$) differs between the TE mode and the TM mode. For example, as demonstrated by the experimental examples below, a light-emitting device can be provided that outputs intense linearly polarized light (e.g., the TM mode) of a particular wavelength (e.g., 610 nm) in the front direction. The angle of directionality of the light output in the front direction is, for example, less than 15°. The term "angle of directionality" refers to the angle of one side with respect to the front direction, which is assumed to be 0°.

Conversely, a submicron structure having a lower periodicity results in a lower directionality, luminous efficiency, polarization, and wavelength selectivity. The periodicity of the submicron structure may be adjusted depending on the need. The periodic structure may be a one-dimensional periodic structure, which has a higher polarization selectivity, or a two-dimensional periodic structure, which allows for a lower polarization.

The submicron structure may include periodic structures. For example, these periodic structures may have different periods or different periodic directions (axes). The periodic structures may be defined on the same plane or may be stacked on top of each other. The light-emitting device may include photoluminescent layers and light-transmissive layers, and they may have submicron structures.

The submicron structure can be used not only to control the light emitted from the photoluminescent layer, but also to efficiently guide excitation light into the photoluminescent layer. That is, the excitation light can be diffracted and coupled into the quasi-guided mode to guide light in the photoluminescent layer and the light-transmissive layer by the submicron structure to efficiently excite the photoluminescent layer. A submicron structure may be used that satisfies the relationship $\lambda_{ex}/n_{wav-ex} < D_{int} < \lambda_{ex}$, where $\lambda_{ex}$ is the wavelength, in air, of the light that excites the photoluminescent material, and $n_{wav-ex}$ is the refractive index of the photoluminescent layer for the excitation light. The symbol $n_{wav-ex}$ is the refractive index of the photoluminescent layer for the emission wavelength of the photoluminescent material. Alternatively, a submicron structure may be used that includes a periodic structure satisfying the relationship $\lambda_{ex}/n_{wav-ex} < p_{ex} < \lambda_{ex}$, where $p_{ex}$ is the period of the periodic structure. The excitation light has a wavelength $\lambda_{ex}$ of, for example, 450 nm, although it may have a shorter wavelength than visible light. If the excitation light has a wavelength within the visible range, it may be output together with the light emitted from the photoluminescent layer.

1. Underlying Knowledge Forming Basis of the Present Disclosure

The underlying knowledge forming the basis for the present disclosure will be described before describing specific embodiments of the present disclosure. As described above, photoluminescent materials such as those used for fluorescent lamps and white LEDs emit light in all directions and thus require optical elements such as reflectors and lenses to emit light in a particular direction. These optical elements, however, can be eliminated (or the size thereof can be reduced) if the photoluminescent layer itself emits directional light. This results in a significant reduction in the size of optical devices and equipment. With this idea in mind, the inventors have conducted a detailed study on the photoluminescent layer to achieve directional light emission.

The inventors have investigated the possibility of inducing light emission with particular directionality so that the light emitted from the photoluminescent layer is localized in a particular direction. Based on Fermi's golden rule, the emission rate $\Gamma$, which is a measure characterizing light emission, is represented by equation (1):

$$\Gamma(r) = \frac{2\pi}{\hbar} \langle (d \cdot E(r)) \rangle^2 \rho(\lambda) \quad (1)$$

In equation (1), r is the vector indicating the position, $\lambda$ is the wavelength of light, d is the dipole vector, E is the electric field vector, and $\rho$ is the density of states. For many substances other than some crystalline substances, the dipole vector d is randomly oriented. The magnitude of the electric field E is substantially constant irrespective of the direction if the size and thickness of the photoluminescent layer are sufficiently larger than the wavelength of light. Hence, in most cases, the value of $\langle (d \cdot E(r)) \rangle^2$ does not depend on the direction. Accordingly, the emission rate $\Gamma$ is constant irrespective of the direction. Thus, in most cases, the photoluminescent layer emits light in all directions.

As can be seen from equation (1), to achieve anisotropic light emission, it is necessary to align the dipole vector d in a particular direction or to enhance the component of the electric field vector in a particular direction. One of these approaches can be employed to achieve directional light emission. In the present disclosure, the results of a detailed study and analysis on structures for utilizing a quasi-guided mode in which the electric field component in a particular direction is enhanced by the confinement of light in the photoluminescent layer will be described below.

2. Structure for Enhancing Only Electric Field in Particular Direction

The inventors have investigated the possibility of controlling light emission using a guided mode with an intense electric field. Light can be coupled into a guided mode using a waveguide structure that itself contains a photoluminescent material. However, a waveguide structure simply formed using a photoluminescent material outputs little or no light in the front direction because the emitted light is coupled into a guided mode. Accordingly, the inventors have investigated the possibility of combining a waveguide containing a photoluminescent material with a periodic structure (including at least projections or recesses). When the electric field of light is guided in a waveguide while overlapping with a periodic structure located on or near the waveguide, a quasi-guided mode is formed by the effect of the periodic structure. That is, the quasi-guided mode is a guided mode restricted by the periodic structure and is characterized in that the antinodes of the amplitude of the electric field have the same period as the periodic structure. Light in this mode is confined in the waveguide structure to enhance the electric field in a particular direction. This mode also interacts with the periodic structure to undergo diffraction so that the light in this mode is converted into light propagating in a particular direction and can thus be output from the waveguide. The electric field of light other than the quasi-guided mode is not enhanced because little or no such light is confined in the waveguide. Thus, most light is coupled into a quasi-guided mode with a large electric field component.

That is, the inventors have investigated the possibility of using a photoluminescent layer containing a photoluminescent material as a waveguide (or a waveguide layer including a photoluminescent layer) in combination with a periodic structure located on or near the waveguide to couple light into a quasi-guided mode in which the light is converted into light propagating in a particular direction, thereby providing a directional light source.

Figure 30:
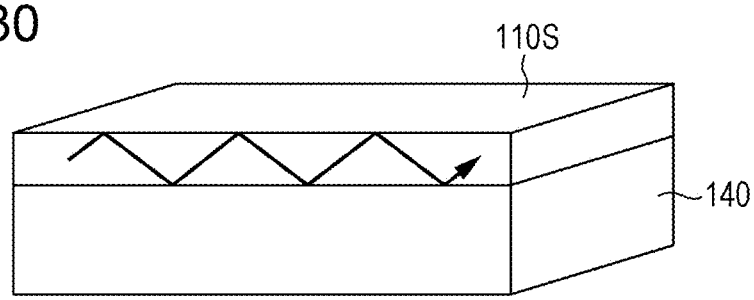
FIG. 30 is a schematic perspective view of an example slab waveguide.

As a simple waveguide structure, the inventors have studied slab waveguides. A slab waveguide has a planar structure in which light is guided. FIG. 30 is a schematic perspective view of an example slab waveguide 110S. There is a mode of light propagating through the waveguide 110S if the waveguide 110S has a higher refractive index than a transparent substrate 140 that supports the waveguide 110S. If such a slab waveguide includes a photoluminescent layer, the electric field of light emitted from an emission point overlaps largely with the electric field of a guided mode. This allows most of the light emitted from the photoluminescent layer to be coupled into the guided mode. If the photoluminescent layer has a thickness close to the wavelength of the light, a situation can be created where there is only a guided mode with a large electric field amplitude.

If a periodic structure is located on or near the photoluminescent layer, the electric field of the guided mode interacts with the periodic structure to form a quasi-guided mode. Even if the photoluminescent layer is composed of layers, a quasi-guided mode is formed as long as the electric field of the guided mode reaches the periodic structure. Not all of the photoluminescent layer needs to be made of a photoluminescent material; it may be a layer including at least a region that functions to emit light.

If the periodic structure is made of a metal, a mode due to the guided mode and plasmon resonance is formed. This mode has different properties from the quasi-guided mode described above and is less effective in enhancing emission because a large loss occurs due to high absorption by the metal. Thus, it is desirable to form the periodic structure using a dielectric with low absorption.

Figure 1B:
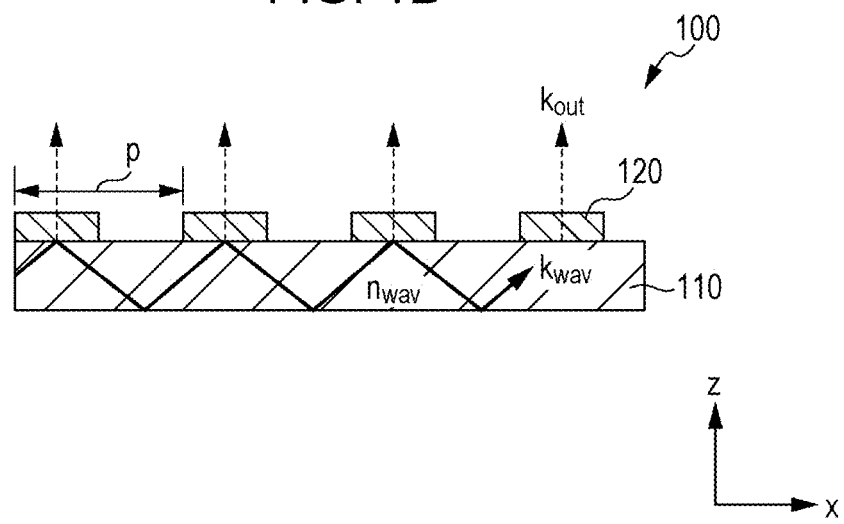
FIG. 1B is a partial sectional view of the light-emitting device shown in FIG. 1A.

The inventors have studied the coupling of light into a quasi-guided mode that can be output as light propagating in a particular angular direction using a periodic structure formed on a waveguide (e.g. photoluminescent layer). FIG. 1A is a schematic perspective view of an example light-emitting device 100 including a waveguide (e.g. photoluminescent layer) 110 and a periodic structure (e.g. light-transmissive layer) 120. The light-transmissive layer 120 may be hereinafter referred to as "periodic structure 120" if the light-transmissive layer 120 forms a periodic structure. That is, a submicron structure is defined on the light-transmissive layer 120. In this example, the periodic structure 120 is a one-dimensional periodic structure in which stripe-shaped projections extending in the y direction are arranged at regular intervals in the x direction. FIG. 1B is a sectional view of the light-emitting device 100 taken along a plane parallel to the xz plane. If a periodic structure 120 having a period p is provided in contact with the waveguide 110, a quasi-guided mode having a wave number $k_{wav}$ in the in-plane direction is converted into light propagating outside the waveguide 110. The wave number $k_{out}$ of the light can be represented by equation (2):

$$k_{out} = k_{wav} - m\frac{2\pi}{p} \qquad (2)$$

where m is an integer indicating the diffraction order.

For simplicity, the light guided in the waveguide 110 is assumed to be a ray of light propagating at an angle $\theta_{wav}$. This approximation gives equations (3) and (4):

$$\frac{k_{wav}\lambda_0}{2\pi} = n_{wav}\sin\theta_{wav} \qquad (3)$$

$$\frac{k_{out}\lambda_0}{2\pi} = n_{out}\sin\theta_{out} \qquad (4)$$

In these equations, $\lambda_0$ is the wavelength of the light in air, $n_{wav}$ is the refractive index of the waveguide 110, $n_{out}$ is the refractive index of the medium from which the light is output, and $\theta_{out}$ is the angle at which the light is output from the waveguide 110 to a substrate or air. From equations (2) to (4), the output angle $\theta_{out}$ can be represented by equation (5):

$$n_{out}\sin\theta_{out} = n_{wav}\sin\theta_{wav} - m\lambda_0/p \qquad (5)$$

If $n_{wav}\sin\theta_{wav} = m\lambda_0/p$ in equation (5), $\theta_{out}=0$, meaning that the light can be output in the direction perpendicular to the plane of the waveguide 110 (i.e., in the front direction).

Based on this principle, light can be coupled into a particular quasi-guided mode and be converted into light having a particular output angle using the periodic structure to output intense light in that direction.

There are some constraints to achieving the above situation. To form a quasi-guided mode, the light propagating through the waveguide 110 has to be totally reflected. The conditions therefor are represented by inequality (6):

$$n_{out} < n_{wav}\sin\theta_{wav} \qquad (6)$$

To diffract the quasi-guided mode using the periodic structure and thereby output the light from the waveguide 110, $-1 < \sin\theta_{out} < 1$ has to be satisfied in equation (5). Hence, inequality (7) has to be satisfied:

$$-1 < \frac{n_{wav}}{n_{out}}\sin\theta_{wav} - \frac{m\lambda_0}{n_{out}p} < 1 \qquad (7)$$

Taking into account inequality (6), inequality (8) may be satisfied:

$$\frac{m\lambda_0}{2n_{out}} < p \qquad (8)$$

To output the light from the waveguide 110 in the front direction (i.e., $\theta_{out}=0$), as can be seen from equation (5), equation (9) has to be satisfied:

$$p = m\lambda_0/(n_{wav}\sin\theta_{wav}) \qquad (9)$$

As can be seen from equation (9) and inequality (6), the required conditions are represented by inequality (10):

$$\frac{m\lambda_0}{n_{wav}} < p < \frac{m\lambda_0}{n_{out}} \qquad (10)$$

If the periodic structure 120 as shown in FIGS. 1A and 1B is provided, it may be designed based on first-order diffracted light (i.e., m=1) because higher-order diffracted light (i.e., m≥2) has low diffraction efficiency. In this embodiment, the period p of the periodic structure 120 is determined so as to satisfy inequality (11), which is given by substituting m=1 into inequality (10):

$$\frac{\lambda_0}{n_{wav}} < p < \frac{\lambda_0}{n_{out}} \qquad (11)$$

If the waveguide (photoluminescent layer) 110 is not in contact with a transparent substrate, as shown in FIGS. 1A and 1B, $n_{out}$ is equal to the refractive index of air (i.e., about 1.0). Thus, the period p may be determined so as to satisfy inequality (12):

$$\frac{\lambda_0}{n_{wav}} < p < \lambda_0 \qquad (12)$$

Figure 1C:
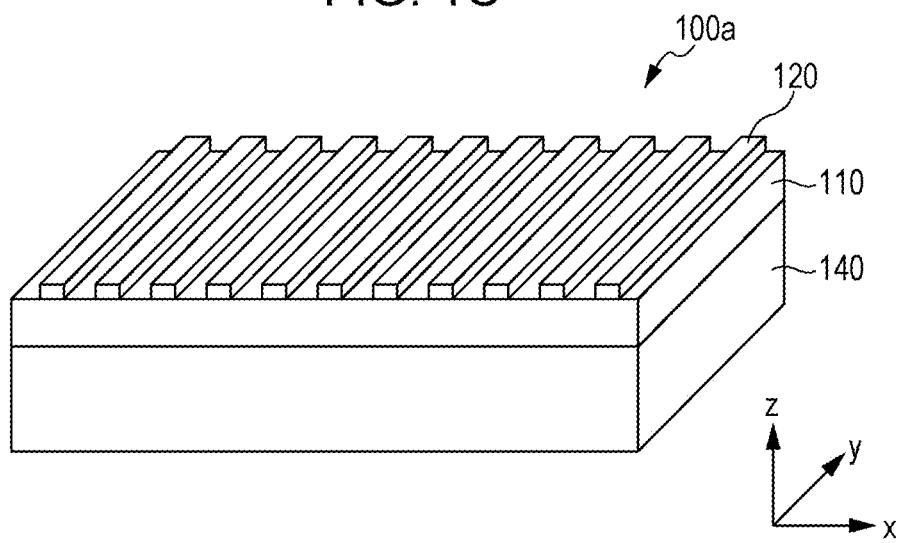
FIG. 1C is a perspective view showing the structure of a light-emitting device according to another embodiment.
Figure 1D:
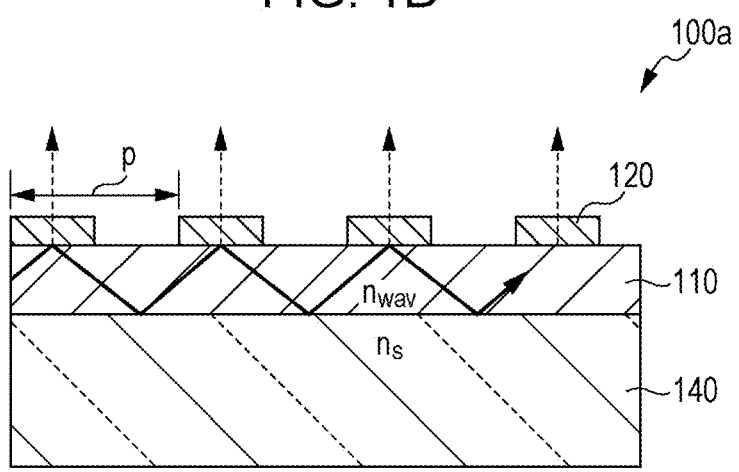
FIG. 1D is a partial sectional view of the light-emitting device shown in FIG. 1C.

Alternatively, a structure as illustrated in FIGS. 1C and 1D may be employed in which the photoluminescent layer 110 and the periodic structure 120 are formed on a transparent substrate 140. The refractive index $n_s$ of the transparent substrate 140 is higher than the refractive index of air. Thus, the period p may be determined so as to satisfy inequality (13), which is given by substituting $n_{out}=n_s$ into inequality (11):

$$\frac{\lambda_0}{n_{wav}} < p < \frac{\lambda_0}{n_s} \qquad (13)$$

Although m=1 is assumed in inequality (10) to give inequalities (12) and (13), m≥2 may be assumed. That is, if both surfaces of the light-emitting device 100 are in contact with air layers, as shown in FIGS. 1A and 1B, the period p may be determined so as to satisfy inequality (14):

$$\frac{m\lambda_0}{n_{wav}} < p < m\lambda_0 \qquad (14)$$

where m is an integer of 1 or more.

Similarly, if the photoluminescent layer 110 is formed on the transparent substrate 140, as in the light-emitting device 100a shown in FIGS. 1C and 1D, the period p may be determined so as to satisfy inequality (15):

$$\frac{m\lambda_0}{n_{wav}} < p < \frac{m\lambda_0}{n_s} \qquad (15)$$

By determining the period p of the periodic structure so as to satisfy the above inequalities, the light emitted from the photoluminescent layer 110 can be output in the front direction, thus providing a directional light-emitting device.

3. Verification by Calculations 3-1. Period and Wavelength Dependence

The inventors verified, by optical analysis, whether the output of light in a particular direction as described above is actually possible. The optical analysis was performed by calculations using DiffractMOD available from Cybernet Systems Co., Ltd. In these calculations, the change in the absorption of external light incident perpendicular to a light-emitting device by a photoluminescent layer was calculated to determine the enhancement of light output perpendicular to the light-emitting device. The calculation of the process by which external incident light is coupled into a quasi-guided mode and is absorbed by the photoluminescent layer corresponds to the calculation of a process opposite to the process by which light emitted from the photoluminescent layer is coupled into a quasi-guided mode and is converted into propagating light output perpendicular to the light-emitting device. Similarly, the electric field distribution of a quasi-guided mode was calculated from the electric field of external incident light.

Figure 2:
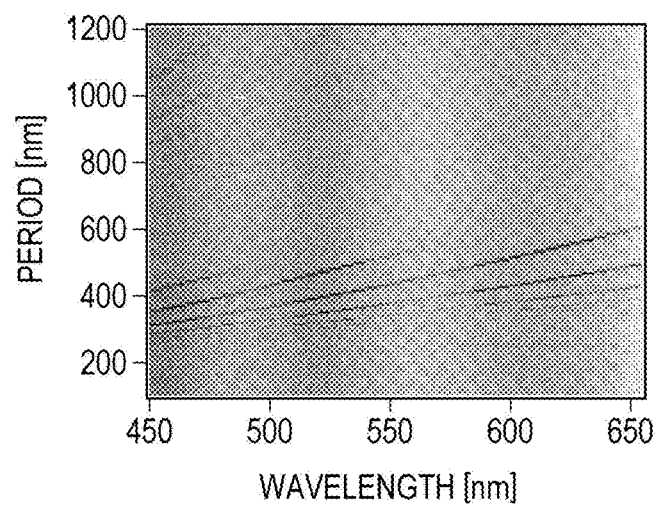
FIG. 2 is a graph showing the results of calculations of the enhancement of light output in the front direction with varying emission wavelengths and varying periods of a periodic structure.

FIG. 2 shows the results of calculations of the enhancement of light output in the front direction with varying emission wavelengths and varying periods of the periodic structure, where the photoluminescent layer was assumed to have a thickness of 1 µm and a refractive index $n_{wav}$ of 1.8, and the periodic structure was assumed to have a height of 50 nm and a refractive index of 1.5. In these calculations, the periodic structure was assumed to be a one-dimensional periodic structure uniform in the y direction, as shown in FIG. 1A, and the polarization of the light was assumed to be the TM mode, which has an electric field component parallel to the y direction. The results in FIG. 2 show that there are enhancement peaks at certain combinations of wavelength and period. In FIG. 2, the magnitude of the enhancement is expressed by different shades of color; a darker color (black) indicates a higher enhancement, whereas a lighter color (white) indicates a lower enhancement.

Figure 3:
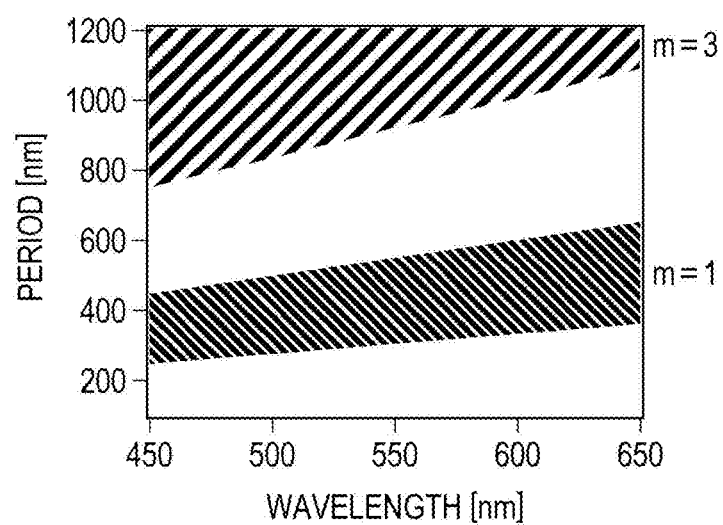
FIG. 3 is a graph illustrating the conditions for m=1 and m=3 in inequality (10)

In the above calculations, the periodic structure was assumed to have a rectangular cross section as shown in FIG. 1B. FIG. 3 is a graph illustrating the conditions for m=1 and m=3 in inequality (10). A comparison between FIGS. 2 and 3 shows that the peaks in FIG. 2 are located within the regions corresponding to m=1 and m=3. The intensity is higher for m=1 because first-order diffracted light has a higher diffraction efficiency than third- or higher-order diffracted light. There is no peak for m=2 because of low diffraction efficiency in the periodic structure.

In FIG. 2, lines are observed in each of the regions corresponding to m=1 and m=3 in FIG. 3. This indicates the presence of quasi-guided modes.

3-2. Thickness Dependence

Figure 4:
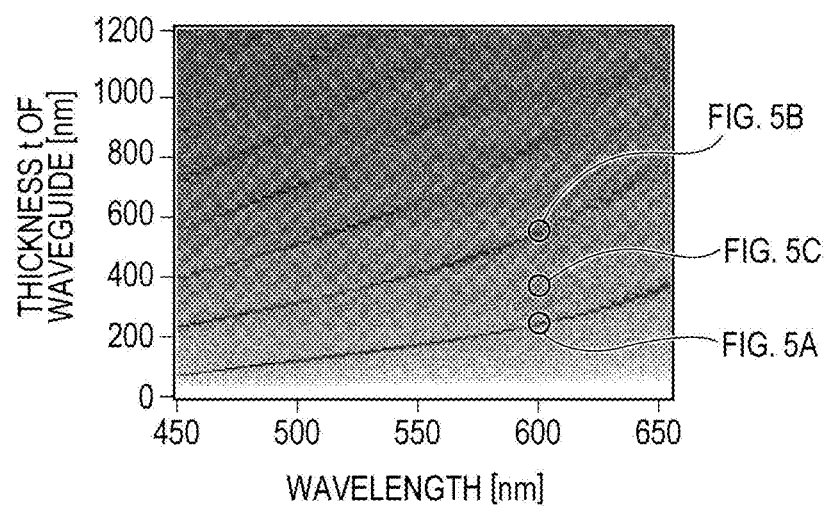
FIG. 4 is a graph showing the results of calculations of the enhancement of light output in the front direction with varying emission wavelengths and varying thicknesses t of a photoluminescent layer.

FIG. 4 is a graph showing the results of calculations of the enhancement of light output in the front direction with varying emission wavelengths and varying thicknesses t of the photoluminescent layer, where the photoluminescent layer was assumed to have a refractive index $n_{wav}$ of 1.8, and the periodic structure was assumed to have a period of 400 nm, a height of 50 nm, and a refractive index of 1.5. FIG. 4 shows that the enhancement of the light peaks at a particular thickness t the photoluminescent layer.

Figure 5A:
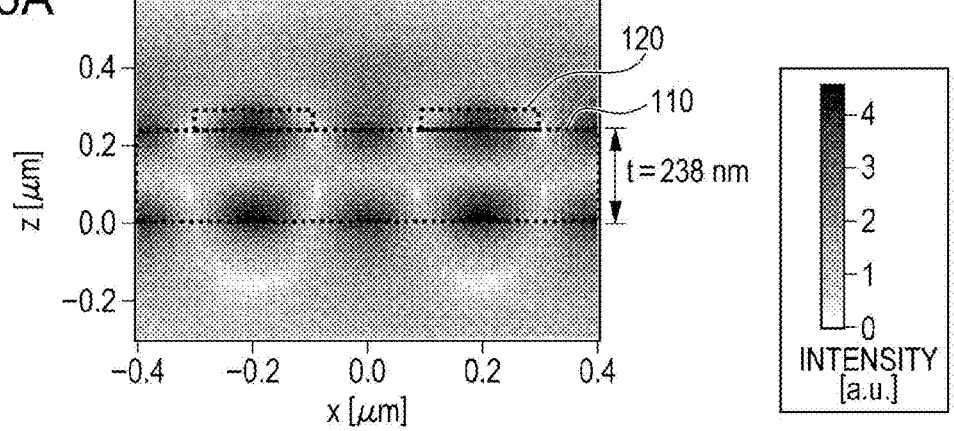
FIG. 5A is a graph showing the results of calculations of the electric field distribution of a mode to guide light in the x direction for a thickness t of 238 nm.
Figure 5B:
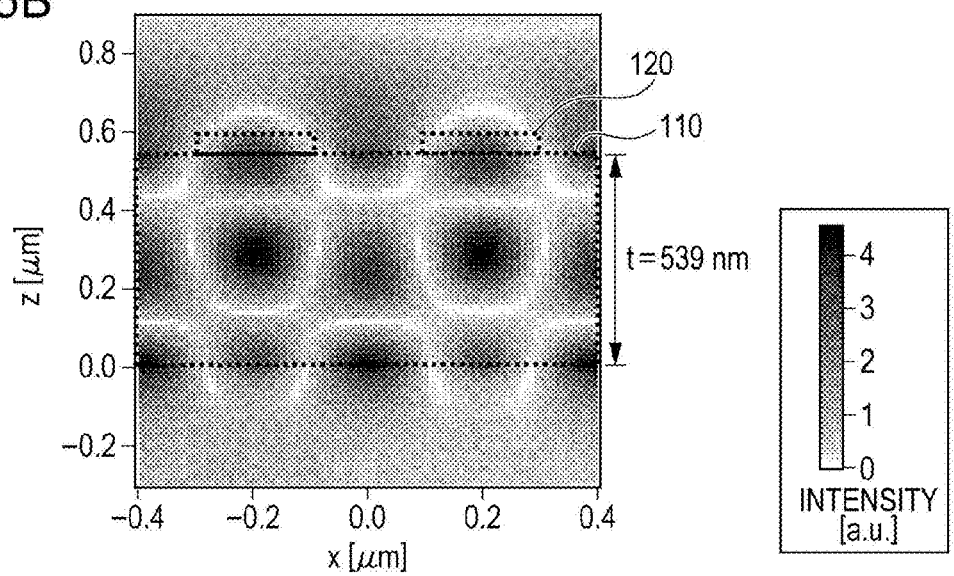
FIG. 5B is a graph showing the results of calculations of the electric field distribution of a mode to guide light in the x direction for a thickness t of 539 nm.
Figure 5C:
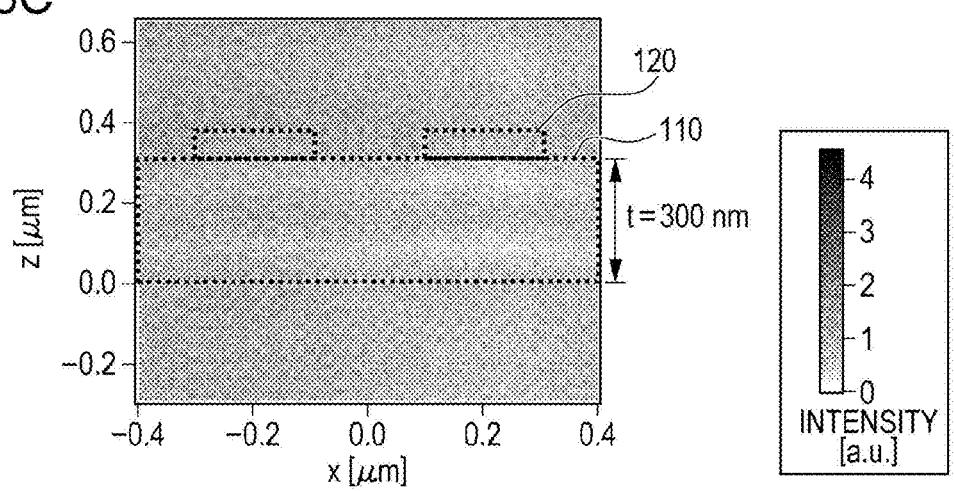
FIG. 5C is a graph showing the results of calculations of the electric field distribution of a mode to guide light in the x direction for a thickness t of 300 nm.

FIGS. 5A and 5B show the results of calculations of the electric field distributions of a mode to guide light in the x direction for a wavelength of 600 nm and thicknesses t of 238 nm and 539 nm, respectively, at which there are peaks in FIG. 4. For comparison, FIG. 5C shows the results of similar calculations for a thickness t of 300 nm, at which there is no peak. In these calculations, as in the above calculations, the periodic structure was a one-dimensional periodic structure uniform in the y direction. In each figure, a black region indicates a higher electric field intensity, whereas a white region indicates a lower electric field intensity. Whereas the results for t=238 nm and t=539 nm show high electric field intensity, the results for t=300 nm shows low electric field intensity as a whole. This is because there are guided modes for t=238 nm and t=539 nm so that light is strongly confined. Furthermore, regions with the highest electric field intensity (i.e., antinodes) are necessarily present in or directly below the projections, indicating the correlation between the electric field and the periodic structure 120. Thus, the resulting guided mode depends on the arrangement of the periodic structure 120. A comparison between the results for t=238 nm and t=539 nm shows that these modes differ in the number of nodes (white regions) of the electric field in the z direction by one.

3-3. Polarization Dependence

Figure 6:
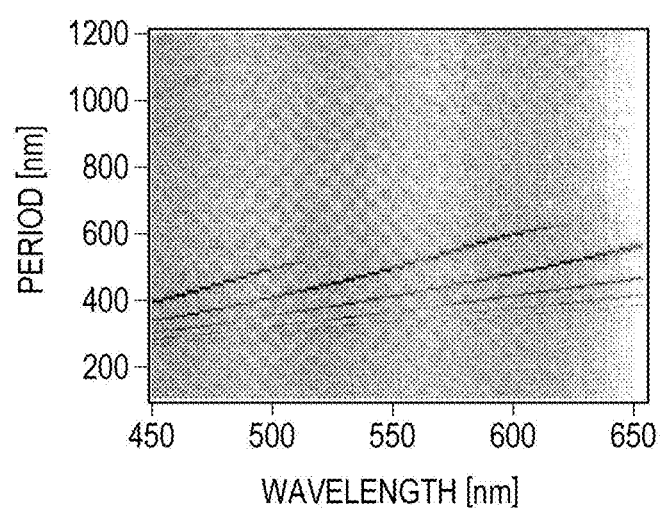
FIG. 6 is a graph showing the results of calculations of the enhancement of light performed under the same conditions as in FIG. 2 except that the polarization of the light was assumed to be the TE mode, which has an electric field component perpendicular to the y direction.

To examine the polarization dependence, the enhancement of light was calculated under the same conditions as in FIG. 2 except that the polarization of the light was assumed to be the TE mode, which has an electric field component perpendicular to the y direction. FIG. 6 shows the results of these calculations. Although the peaks in FIG. 6 differ slightly in position from the peaks for the TM mode (FIG. 2), they are located within the regions shown in FIG. 3. This demonstrates that the structure according to this embodiment is effective for both of the TM mode and the TE mode.

3-4. Two-Dimensional Periodic Structure

Figure 7A:
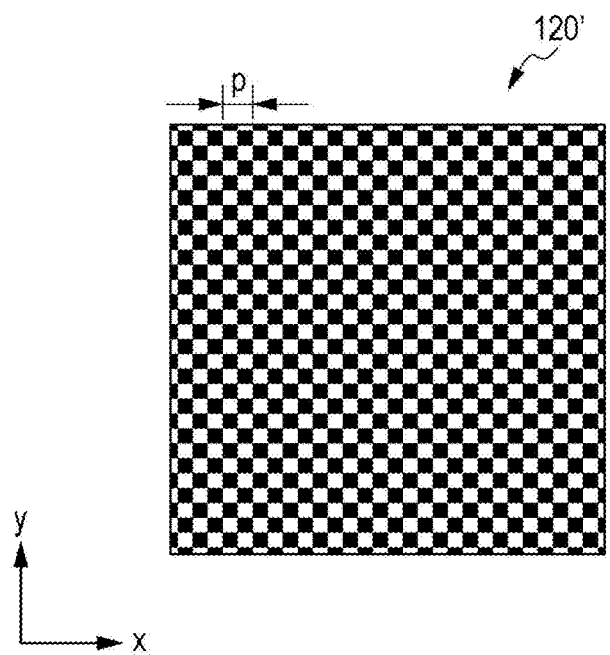
FIG. 7A is a plan view of an example two-dimensional periodic structure.
Figure 7B:
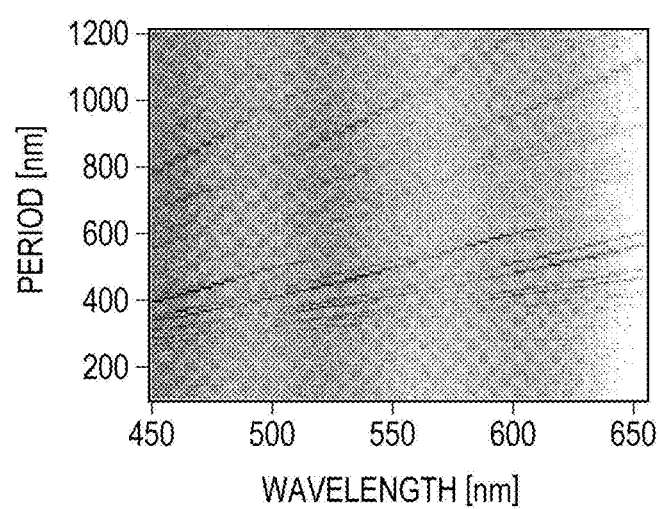
FIG. 7B is a graph showing the results of calculations performed as in FIG. 2 for the two-dimensional periodic structure.

The effect of a two-dimensional periodic structure was also studied. FIG. 7A is a partial plan view of a two-dimensional periodic structure 120' including recesses and projections arranged in both of the x direction and the y direction. In FIG. 7A, the black regions indicate the projections, and the white regions indicate the recesses. For a two-dimensional periodic structure, both of the diffraction in the x direction and the diffraction in the y direction have to be taken into account. Although the diffraction in only the x direction or the y direction is similar to that in a one-dimensional periodic structure, a two-dimensional periodic structure can be expected to give different results from a one-dimensional periodic structure because diffraction also occurs in a direction containing both of an x component and a y component (e.g., a direction inclined at 45°). FIG. 7B shows the results of calculations of the enhancement of light for the two-dimensional periodic structure. The calculations were performed under the same conditions as in FIG. 2 except for the type of periodic structure. As shown in FIG. 7B, peaks matching the peaks for the TE mode in FIG. 6 were observed in addition to peaks matching the peaks for the TM mode in FIG. 2. These results demonstrate that the two-dimensional periodic structure also converts and outputs the TE mode by diffraction. For a two-dimensional periodic structure, the diffraction that simultaneously satisfies the first-order diffraction conditions in both of the x direction and the y direction also has to be taken into account. Such diffracted light is output in the direction at the angle corresponding to √2 times (i.e., $2^{1/2}$ times) the period p. Thus, peaks will occur at √2 times the period p in addition to peaks that occur in a one-dimensional periodic structure. Such peaks are observed in FIG. 7B.

Figure 18A:
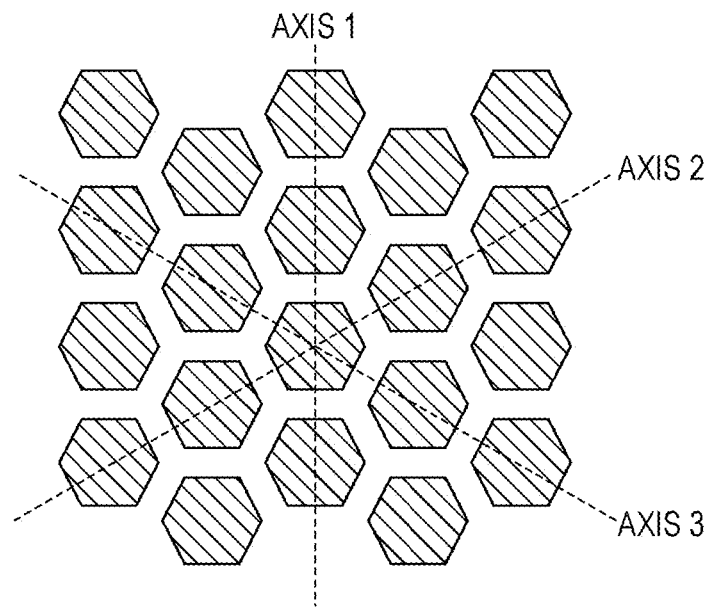
FIG. 18A is a schematic view of an example two-dimensional periodic structure.
Figure 18B:
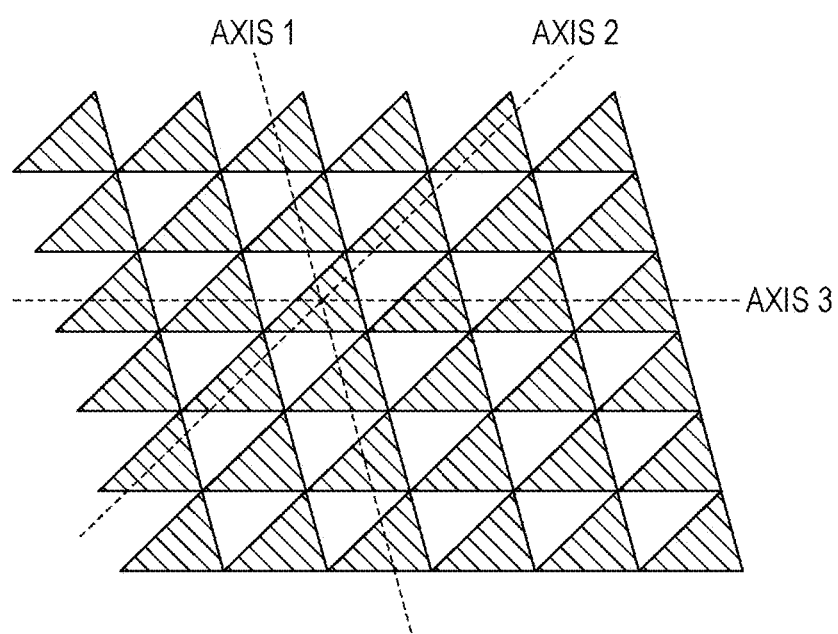
FIG. 18B is a schematic view of another example two-dimensional periodic structure.

The two-dimensional periodic structure does not have to be a square grid structure having equal periods in the x direction and the y direction, as shown in FIG. 7A, but may be a hexagonal grid structure, as shown in FIG. 18A, or a triangular grid structure, as shown in FIG. 18B. The two-dimensional periodic structure may have different periods in different directions (e.g., in the x direction and the y direction for a square grid structure).

In this embodiment, as demonstrated above, light in a characteristic quasi-guided mode formed by the periodic structure and the photoluminescent layer can be selectively output only in the front direction through diffraction by the periodic structure. With this structure, the photoluminescent layer can be excited with excitation light such as ultraviolet light or blue light to output directional light.

4. Study on Constructions of Periodic Structure and Photoluminescent Layer

The effects of changes in various conditions such as the constructions and refractive indices of the periodic structure and the photoluminescent layer will now be described.

4-1. Refractive Index of Periodic Structure

Figure 8:
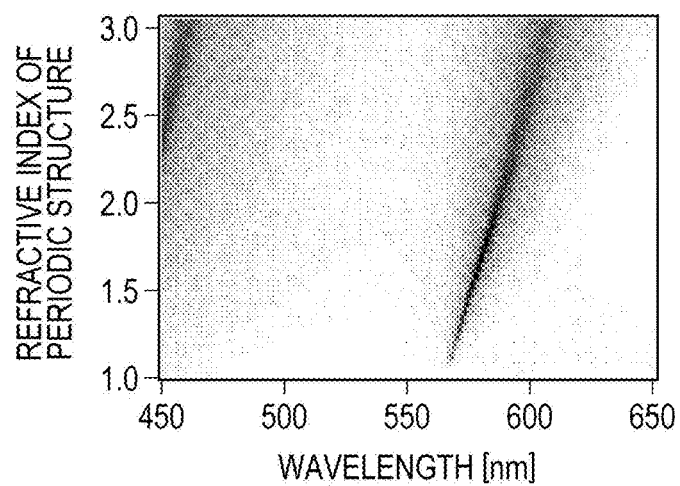
FIG. 8 is a graph showing the results of calculations of the enhancement of light output in the front direction with varying emission wavelengths and varying refractive indices of the periodic structure.
Figure 9:
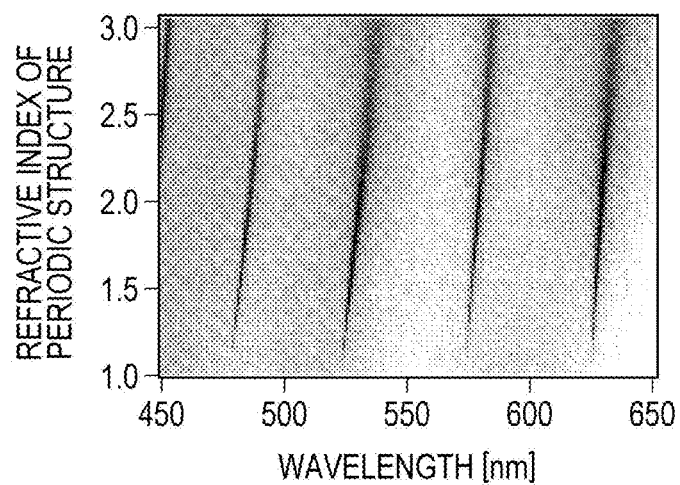
FIG. 9 is a graph showing the results obtained under the same conditions as in FIG. 8 except that the photoluminescent layer was assumed to have a thickness of 1,000 nm.

The refractive index of the periodic structure was studied. In the calculations performed herein, the photoluminescent layer was assumed to have a thickness of 200 nm and a refractive index $n_{wav}$ of 1.8, the periodic structure was assumed to be a one-dimensional periodic structure uniform in the y direction, as shown in FIG. 1A, having a height of 50 nm and a period of 400 nm, and the polarization of the light was assumed to be the TM mode, which has an electric field component parallel to the y direction. FIG. 8 shows the results of calculations of the enhancement of light output in the front direction with varying emission wavelengths and varying refractive indices of the periodic structure. FIG. 9 shows the results obtained under the same conditions except that the photoluminescent layer was assumed to have a thickness of 1,000 nm.

The results show that a photoluminescent layer with a thickness of 1,000 nm (FIG. 9) results in a smaller shift in the wavelength at which the light intensity peaks (i.e., peak wavelength) with the change in the refractive index of the periodic structure than a photoluminescent layer with a thickness of 200 nm (FIG. 8). This is because the quasi-guided mode is more affected by the refractive index of the periodic structure as the photoluminescent layer is thinner. Specifically, a periodic structure with a higher refractive index increases the effective refractive index and thus shifts the peak wavelength toward longer wavelengths, and this effect is more noticeable as the photoluminescent layer is thinner. The effective refractive index is determined by the refractive index of the medium present in the region where the electric field of the quasi-guided mode is distributed.

The results also show that a periodic structure with a higher refractive index results in a broader peak and a lower intensity. This is because a periodic structure with a higher refractive index outputs light in the quasi-guided mode at a higher rate and is therefore less effective in confining the light, i.e., has a lower Q value. To maintain a high peak intensity, a structure may be employed in which light is moderately output using a quasi-guided mode that is effective in confining the light (i.e., has a high Q value). This means that it is undesirable to use a periodic structure made of a material having a much higher refractive index than the photoluminescent layer. Thus, to achieve a high peak intensity and Q value, the periodic structure (i.e., the light-transmissive layer) may be made of a dielectric having a refractive index lower than or similar to that of the photoluminescent layer. This is also true if the photoluminescent layer contains materials other than photoluminescent materials.

4-2. Height of Periodic Structure

Figure 10:
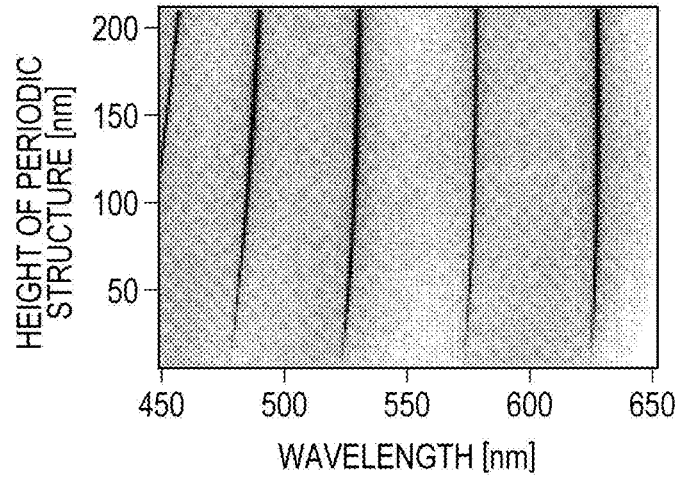
FIG. 10 is a graph showing the results of calculations of the enhancement of light output in the front direction with varying emission wavelengths and varying heights of the periodic structure.
Figure 11:
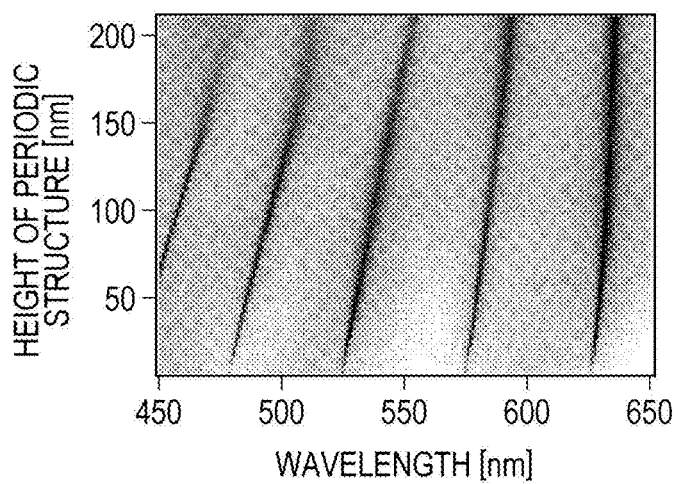
FIG. 11 is a graph showing the results of calculations performed under the same conditions as in FIG. 10 except that the periodic structure was assumed to have a refractive index $n_p$ of 2.0.

The height of the periodic structure was then studied. In the calculations performed herein, the photoluminescent layer was assumed to have a thickness of 1,000 nm and a refractive index $n_{wav}$ of 1.8, the periodic structure was assumed to be a one-dimensional periodic structure uniform in the y direction, as shown in FIG. 1A, having a refractive index $n_p$ of 1.5 and a period of 400 nm, and the polarization of the light was assumed to be the TM mode, which has an electric field component parallel to the y direction. FIG. 10 shows the results of calculations of the enhancement of light output in the front direction with varying emission wavelengths and varying heights of the periodic structure. FIG. 11 shows the results of calculations performed under the same conditions except that the periodic structure was assumed to have a refractive index $n_p$ of 2.0. Whereas the results in FIG. 10 show that the peak intensity and the Q value (i.e., the peak line width) do not change above a certain height of the periodic structure, the results in FIG. 11 show that the peak intensity and the Q value decrease with increasing height of the periodic structure. If the refractive index $n_{wav}$ of the photoluminescent layer is higher than the refractive index $n_p$ of the periodic structure (FIG. 10), the light is totally reflected, and only a leaking (i.e., evanescent) portion of the electric field of the quasi-guided mode interacts with the periodic structure. If the periodic structure has a sufficiently large height, the influence of the interaction between the evanescent portion of the electric field and the periodic structure remains constant irrespective of the height. In contrast, if the refractive index $n_{wav}$ of the photoluminescent layer is lower than the refractive index $n_p$ of the periodic structure (FIG. 11), the light reaches the surface of the periodic structure without being totally reflected and is therefore more influenced by a periodic structure with a larger height. As shown in FIG. 11, a height of about 100 nm is sufficient, and the peak intensity and the Q value decrease above a height of 150 nm. Thus, if the refractive index $n_{wav}$ of the photoluminescent layer is lower than the refractive index $n_p$ of the periodic structure, the periodic structure may have a height of 150 nm or less to achieve a high peak intensity and Q value.

4-3. Polarization Direction

Figure 12:
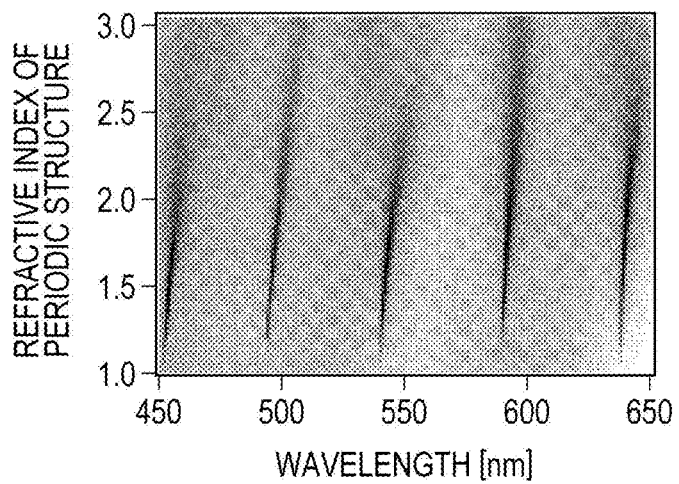
FIG. 12 is a graph showing the results of calculations performed under the same conditions as in FIG. 9 except that the polarization of the light was assumed to be the TE mode, which has an electric field component perpendicular to the y direction.

The polarization direction was then studied. FIG. 12 shows the results of calculations performed under the same conditions as in FIG. 9 except that the polarization of the light was assumed to be the TE mode, which has an electric field component perpendicular to the y direction. The TE mode is more influenced by the periodic structure than the TM mode because the electric field of the quasi-guided mode leaks more largely for the TE mode than for the TM mode. Thus, the peak intensity and the Q value decrease more significantly for the TE mode than for the TM mode if the refractive index $n_p$ of the periodic structure is higher than the refractive index $n_{wav}$ of the photoluminescent layer.

4-4. Refractive Index of Photoluminescent Layer

Figure 13:
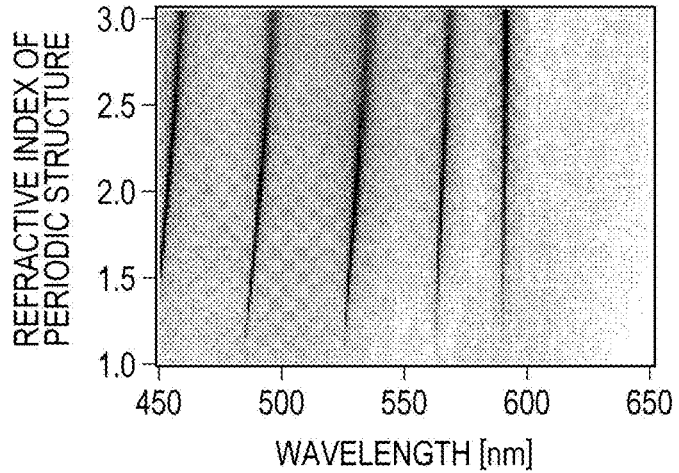
FIG. 13 is a graph showing the results of calculations performed under the same conditions as in FIG. 9 except that the photoluminescent layer was assumed to have a refractive index $n_{wav}$ of 1.5.

The refractive index of the photoluminescent layer was then studied. FIG. 13 shows the results of calculations performed under the same conditions as in FIG. 9 except that the photoluminescent layer was assumed to have a refractive index $n_{wav}$ of 1.5. The results for the photoluminescent layer having a refractive index $n_{wav}$ of 1.5 are similar to the results in FIG. 9. However, light of a wavelength of 600 nm or more was not output in the front direction. This is because, from inequality (10), $\lambda_0 < n_{wav} \times p/m = 1.5 \times 400$ nm/1=600 nm.

The above analysis demonstrates that a high peak intensity and Q value can be achieved if the periodic structure has a refractive index lower than or similar to the refractive index of the photoluminescent layer or if the periodic structure has a higher refractive index than the photoluminescent layer and a height of 150 nm or less.

5. Modifications

Modifications of this embodiment will now be described.

5-1. Structure Including Substrate

As described above, the light-emitting device may have a structure in which the photoluminescent layer 110 and the periodic structure 120 are formed on the transparent substrate 140, as shown in FIGS. 1C and 1D. Such a light-emitting device 100a may be fabricated by forming a thin film of the photoluminescent material for the photoluminescent layer 110 (optionally containing a matrix material; the same applies hereinafter) on the transparent substrate 140 and then forming the periodic structure 120 thereon. In this structure, the refractive index $n_s$ of the transparent substrate 140 has to be lower than or equal to the refractive index $n_{wav}$ of the photoluminescent layer 110 so that the photoluminescent layer 110 and the periodic structure 120 function to output light in a particular direction. If the transparent substrate 140 is provided in contact with the photoluminescent layer 110, the period p has to be set so as to satisfy inequality (15), which is given by replacing the refractive index $n_{out}$ of the output medium in inequality (10) by $n_s$.

Figure 14:
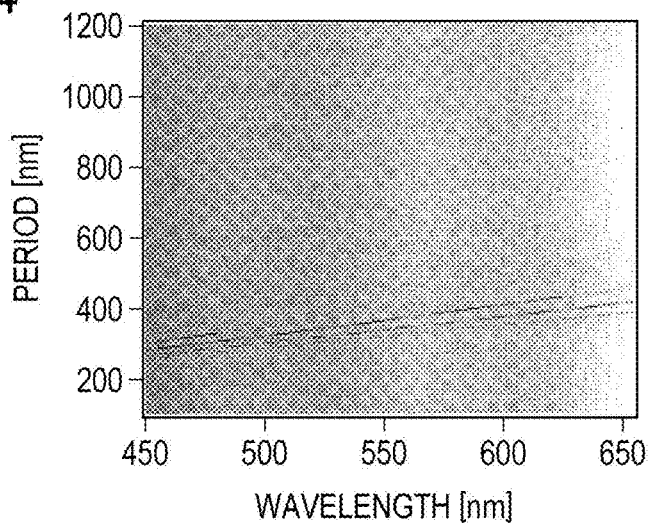
FIG. 14 is a graph showing the results of calculations performed under the same conditions as in FIG. 2 except that the photoluminescent layer and the periodic structure were assumed to be located on a transparent substrate having a refractive index of 1.5.
Figure 15:
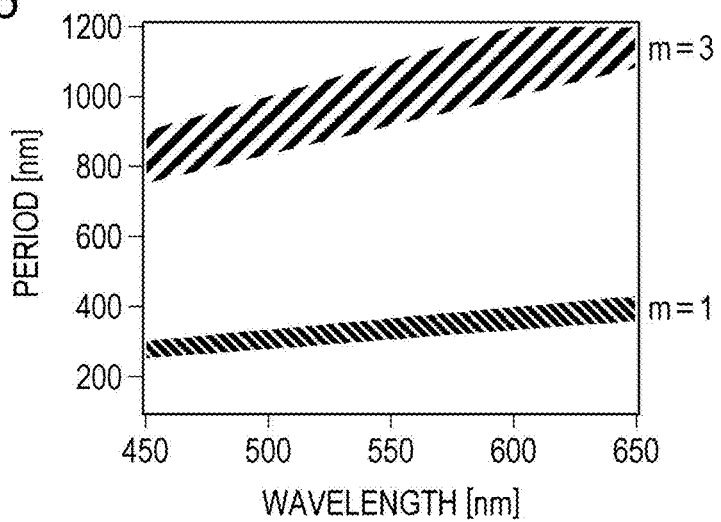
FIG. 15 is a graph illustrating the conditions represented by inequality (15)

To demonstrate this, calculations were performed under the same conditions as in FIG. 2 except that the photoluminescent layer 110 and the periodic structure 120 were assumed to be located on a transparent substrate 140 having a refractive index of 1.5. FIG. 14 shows the results of these calculations. As in the results in FIG. 2, light intensity peaks are observed at particular periods for each wavelength, although the ranges of periods where peaks appear differ from those in FIG. 2. FIG. 15 is a graph illustrating the conditions represented by inequality (15), which is given by substituting $n_{out} = n_s$ into inequality (10). In FIG. 14, light intensity peaks are observed in the regions corresponding to the ranges shown in FIG. 15.

Thus, for the light-emitting device 100a, in which the photoluminescent layer 110 and the periodic structure 120 are located on the transparent substrate 140, a period p that satisfies inequality (15) is effective, and a period p that satisfies inequality (13) is significantly effective.

5-2. Light-Emitting Apparatus Including Excitation Light Source

Figure 16:
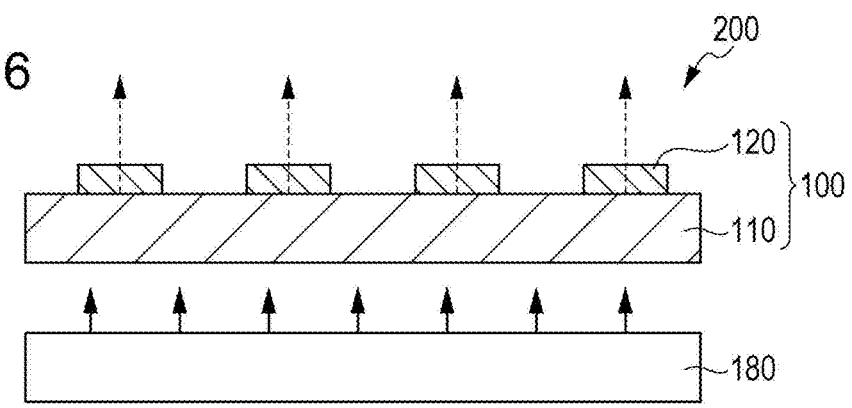
FIG. 16 is a schematic view of an example light-emitting apparatus including the light-emitting device shown in FIGS. 1A and 1B and a light source that directs excitation light into the photoluminescent layer.

FIG. 16 is a schematic view of an example light-emitting apparatus 200 including the light-emitting device 100 shown in FIGS. 1A and 1B and a light source 180 that directs excitation light into the photoluminescent layer 110. In this embodiment, as described above, the photoluminescent layer can be excited with excitation light such as ultraviolet light or blue light to output directional light. The light source 180 can be configured to emit such excitation light to provide a directional light-emitting apparatus 200. Although the wavelength of the excitation light emitted from the light source 180 is typically within the ultraviolet or blue range, it is not necessarily within these ranges, but may be determined depending on the photoluminescent material for the photoluminescent layer 110. Although the light source 180 illustrated in FIG. 16 is configured to direct excitation light into the bottom surface of the photoluminescent layer 110, it may be configured otherwise, for example, to direct excitation light into the top surface of the photoluminescent layer 110.

Figure 17A:
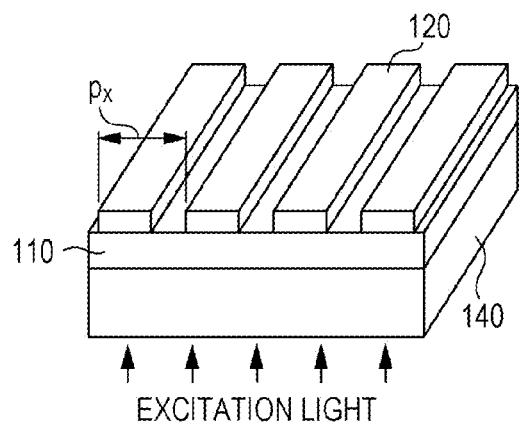
FIGS. 17A to 17D illustrate structures in which excitation light is coupled into a quasi-guided mode to efficiently output light.
Figure 17B:
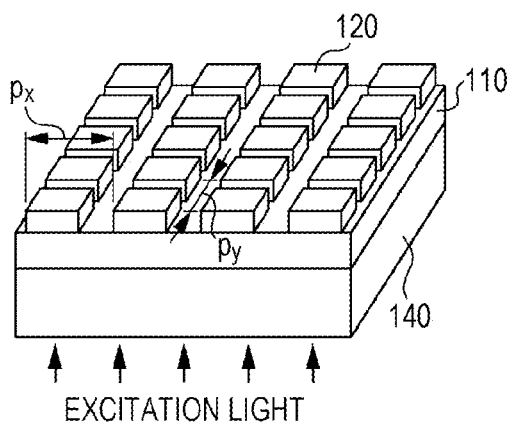

The excitation light may be coupled into a quasi-guided mode to efficiently output light. This method is illustrated in FIGS. 17A to 17D. In this example, as in the structure shown in FIGS. 1C and 1D, the photoluminescent layer 110 and the periodic structure 120 are formed on the transparent substrate 140. As shown in FIG. 17A, the period $p_x$ in the x direction is first determined so as to enhance light emission. As shown in FIG. 17B, the period $p_y$ in the y direction is then determined so as to couple the excitation light into a quasi-guided mode. The period $p_x$ is determined so as to satisfy the conditions given by replacing p in inequality (10) by $p_x$. The period $p_y$ is determined so as to satisfy inequality (16):

$$\frac{m\lambda_{ex}}{n_{wav}} < p_y < \frac{m\lambda_{ex}}{n_{out}} \qquad (16)$$

where m is an integer of 1 or more, $\lambda_{ex}$ is the wavelength of the excitation light, and $n_{out}$ is the refractive index of the medium having the highest refractive index of the media in contact with the photoluminescent layer 110 except the periodic structure 120.

In the example in FIGS. 17A and 17B, $n_{out}$ is the refractive index $n_s$ of the transparent substrate 140. For a structure including no transparent substrate 140, as illustrated in FIG. 16, $n_{out}$ is the refractive index of air (i.e., about 1.0).

In particular, the excitation light can be more effectively converted into a quasi-guided mode if m=1, i.e., if the period $p_y$ is determined so as to satisfy inequality (17):

$$\frac{\lambda_{ex}}{n_{wav}} < p < \frac{\lambda_{ex}}{n_{out}} \qquad (17)$$

Thus, the excitation light can be converted into a quasi-guided mode if the period $p_y$ is set so as to satisfy the conditions represented by inequality (16) (particularly, the conditions represented by inequality (17)). As a result, the photoluminescent layer 110 can efficiently absorb the excitation light of the wavelength $\lambda_{ex}$.

Figure 17C:
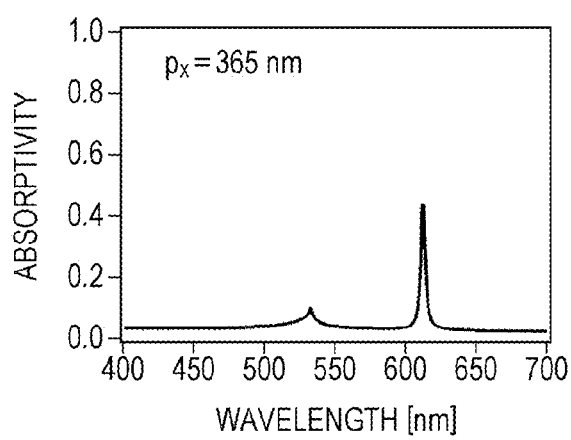
Figure 17D:
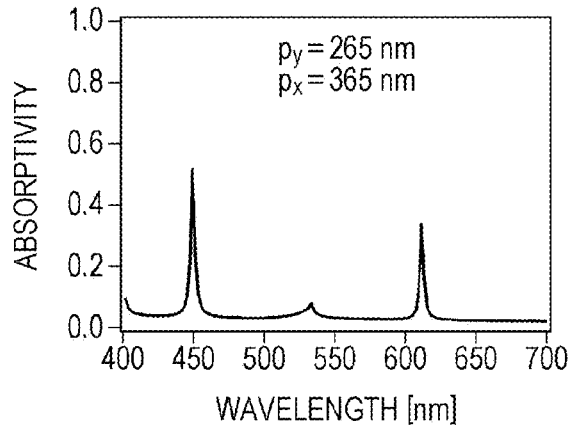

FIGS. 17C and 17D are the results of calculations of the proportion of absorbed light to light incident on the structures shown in FIGS. 17A and 17B, respectively, for each wavelength. In these calculations, $p_x = 365$ nm, $p_y = 265$ nm, the photoluminescent layer 110 was assumed to have an emission wavelength $\lambda$ of about 600 nm, the excitation light was assumed to have a wavelength $\lambda_{ex}$ of about 450 nm, and the photoluminescent layer 110 was assumed to have an extinction coefficient of 0.003. As shown in FIG. 17D, the photoluminescent layer 110 has high absorptivity not only for the light emitted from the photoluminescent layer 110, but also for the excitation light, i.e., light of a wavelength of about 450 nm. This indicates that the incident light is effectively converted into a quasi-guided mode to increase the proportion of the light absorbed into the photoluminescent layer 110. The photoluminescent layer 110 also has high absorptivity for the emission wavelength, i.e., about 600 nm. This indicates that light of a wavelength of about 600 nm incident on this structure is similarly effectively converted into a quasi-guided mode. The periodic structure 120 shown in FIG. 17B is a two-dimensional periodic structure including structures having different periods (i.e., different periodic components) in the x direction and the y direction. Such a two-dimensional periodic structure including periodic components allows for high excitation efficiency and high output intensity. Although the excitation light is incident on the transparent substrate 140 in FIGS. 17A and 17B, the same effect can be achieved if the excitation light is incident on the periodic structure 120.

Also available are two-dimensional periodic structures including periodic components as shown in FIGS. 18A and 18B. The structure shown in FIG. 18A includes periodically arranged projections having a hexagonal planar shape. The structure shown in FIG. 18B includes periodically arranged projections having a triangular planar shape. These structures have major axes (axes 1 to 3 in the examples in FIGS. 18A and 18B) that can be assumed to be periods. Thus, different periods can be assigned to different axial directions. These periods may be set so as to increase the directionality of light of different wavelengths or to efficiently absorb the excitation light. In any case, each period is set so as to satisfy the conditions corresponding to inequality (10).

5-3. Periodic Structure on Transparent Substrate

Figure 19A:
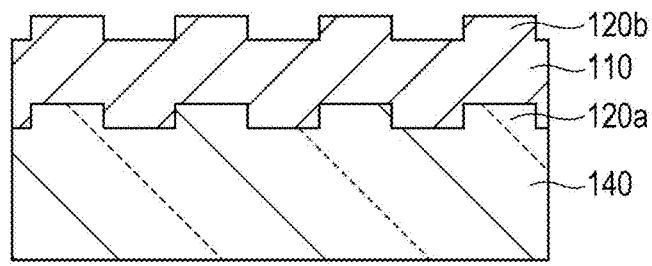
FIG. 19A is a schematic view of a modification in which the periodic structure is formed on the transparent substrate.
Figure 19B:
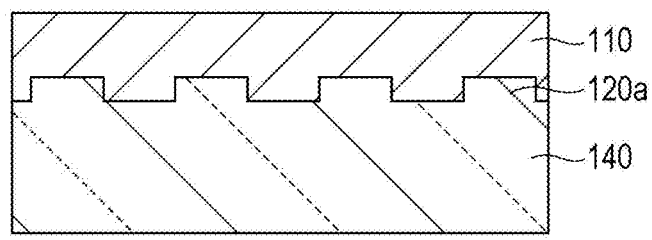
FIG. 19B is a schematic view of another modification in which the periodic structure is formed on the transparent substrate.

As shown in FIGS. 19A and 19B, a periodic structure 120a may be formed on the transparent substrate 140, and the photoluminescent layer 110 may be located thereon. In the example in FIG. 19A, the photoluminescent layer 110 is formed along the texture of the periodic structure 120a on the transparent substrate 140. As a result, a periodic structure 120b with the same period is formed in the surface of the photoluminescent layer 110. In the example in FIG. 19B, the surface of the photoluminescent layer 110 is planarized. In these examples, directional light emission can be achieved by setting the period p of the periodic structure 120a so as to satisfy inequality (15).

Figure 19C:
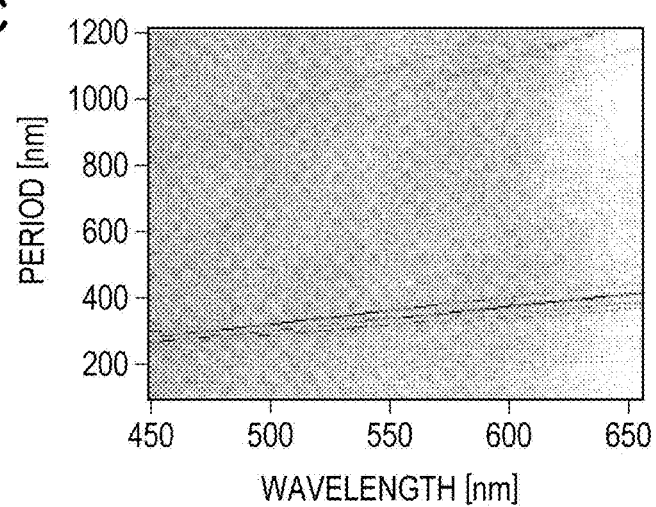
FIG. 19C is a graph showing the results of calculations of the enhancement of light output from the structure in FIG. 19A in the front direction with varying emission wavelengths and varying periods of the periodic structure.

To verify the effect of these structures, the enhancement of light output from the structure in FIG. 19A in the front direction was calculated with varying emission wavelengths and varying periods of the periodic structure. In these calculations, the photoluminescent layer 110 was assumed to have a thickness of 1,000 nm and a refractive index $n_{wav}$ of 1.8, the periodic structure 120a was assumed to be a one-dimensional periodic structure uniform in the y direction having a height of 50 nm, a refractive index $n_p$ of 1.5, and a period of 400 nm, and the polarization of the light was assumed to be the TM mode, which has an electric field component parallel to the y direction. FIG. 19C shows the results of these calculations. In these calculations, light intensity peaks were observed at the periods that satisfy the conditions represented by inequality (15).

5-4. Powder

According to the above embodiment, light of any wavelength can be enhanced by adjusting the period of the periodic structure and the thickness of the photoluminescent layer. For example, if the structure shown in FIGS. 1A and 1B is formed using a photoluminescent material that emits light over a wide wavelength range, only light of a certain wavelength can be enhanced. Accordingly, the structure of the light-emitting device 100 as shown in FIGS. 1A and 1B may be provided in powder form for use as a fluorescent material. Alternatively, the light-emitting device 100 as shown in FIGS. 1A and 1B may be embedded in resin or glass.

Figure 20:
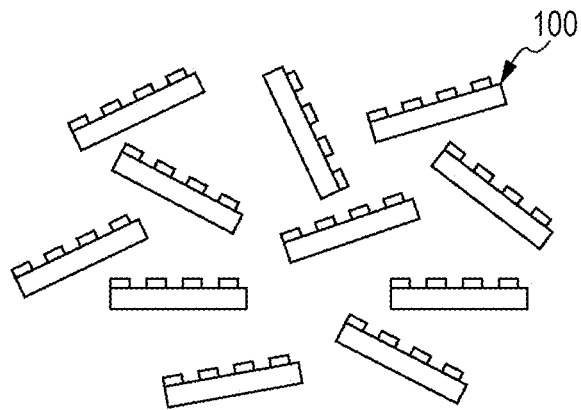
FIG. 20 is a schematic view of a mixture of light-emitting devices in powder form.

The single structure as shown in FIGS. 1A and 1B can output only light of a certain wavelength in a particular direction and is therefore not suitable for outputting, for example, white light, which has a wide wavelength spectrum. Accordingly, as shown in FIG. 20, light-emitting devices 100 that differ in the conditions such as the period of the periodic structure and the thickness of the photoluminescent layer may be mixed in powder form to provide a light-emitting apparatus with a wide wavelength spectrum. In this case, the individual light-emitting devices 100 have sizes of, for example, several micrometers to several millimeters in one direction and can include, for example, one-or two-dimensional periodic structures with several periods to several hundreds of periods.

5-5. Array of Structures with Different Periods

Figure 21:
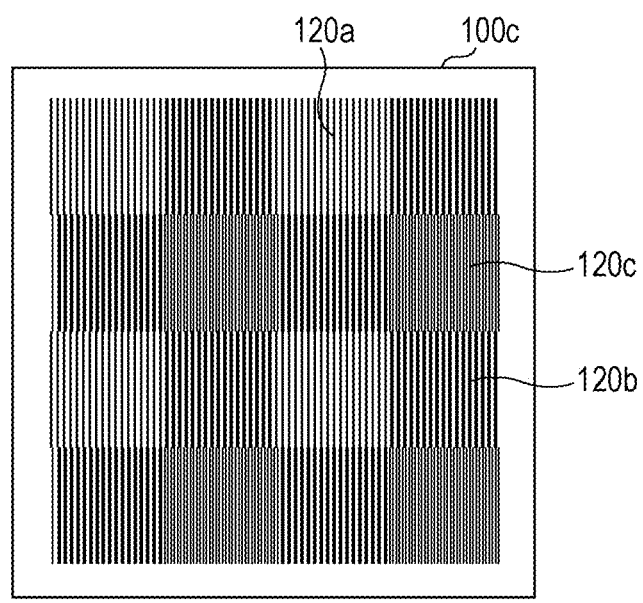
FIG. 21 is a plan view of an example two-dimensional array of periodic structures having different periods on the photoluminescent layer.

FIG. 21 is a plan view of an example two-dimensional array of periodic structures having different periods on the photoluminescent layer. In this example, three types of periodic structures 120a, 120b, and 120c are arranged without any space therebetween. The periods of the periodic structures 120a, 120b, and 120c are set so as to output, for example, light in the red, green, and blue wavelength ranges, respectively, in the front direction. Thus, structures having different periods can be arranged on the photoluminescent layer to output directional light with a wide wavelength spectrum. The periodic structures are not necessarily configured as described above, but may be configured in any manner.

5-6. Layered Structure

Figure 22:
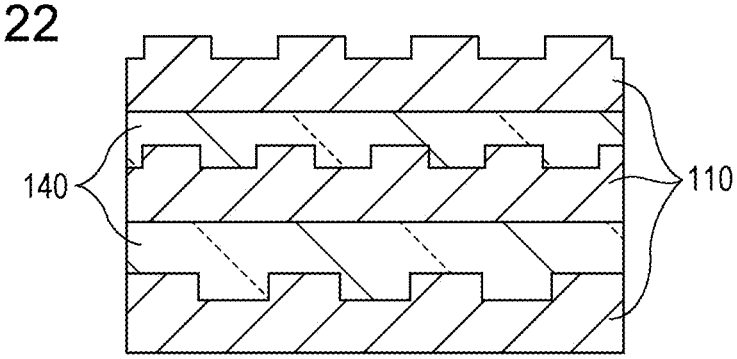
FIG. 22 is a graph showing an example light-emitting device having a layered structure including photoluminescent layers having a texture formed thereon.

FIG. 22 shows an example light-emitting device having a layered structure including photoluminescent layers 110 having a texture formed thereon and transparent substrates 140 between the photoluminescent layers 110. The texture formed on the photoluminescent layer 110 in each layer corresponds to a periodic structure. The example in FIG. 22 includes three periodic structures having different periods. The periods of these periodic structures are set so as to output light in the red, green, and blue wavelength ranges in the front direction. The photoluminescent layer 110 in each layer is made of a material that emits light of the color corresponding to the period of the periodic structure in that layer. Thus, periodic structures having different periods can be stacked on top of each other to output directional light with a wide wavelength spectrum.

The number of layers and the constructions of the photoluminescent layer 110 and the periodic structure in each layer are not limited to those described above, but may be selected as appropriate. For example, for a structure including two layers, first and second photoluminescent layers are formed opposite each other with a light-transmissive substrate therebetween, and first and second periodic structures are formed on the surfaces of the first and second photoluminescent layers, respectively. In this case, the first photoluminescent layer and the first periodic structure may together satisfy the conditions corresponding to inequality (15), whereas the second photoluminescent layer and the second periodic structure may together satisfy the conditions corresponding to inequality (15). For a structure including three or more layers, the photoluminescent layer and the periodic structure in each layer may satisfy the conditions corresponding to inequality (15). The positional relationship between the photoluminescent layers and the periodic structures in FIG. 22 may be reversed. Although the layers illustrated by the example in FIG. 22 have different periods, they may all have the same period. In this case, although the spectrum cannot be broadened, the emission intensity can be increased.

5-7. Structure Including Protective Layer

Figure 23:
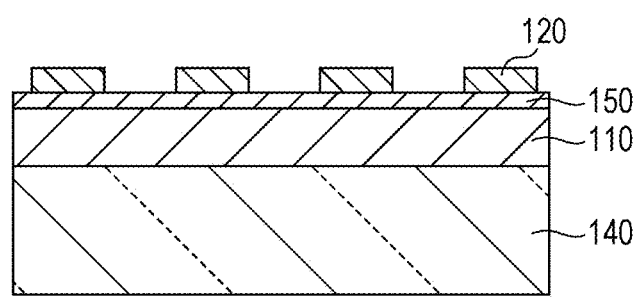
FIG. 23 is a sectional view of an example structure including a protective layer between the photoluminescent layer and the periodic structure.

FIG. 23 is a sectional view of an example structure including a protective layer 150 between the photoluminescent layer 110 and the periodic structure 120. The protective layer 150 may be provided to protect the photoluminescent layer 110. However, if the protective layer 150 has a lower refractive index than the photoluminescent layer 110, the electric field of the light leaks into the protective layer 150 only by about half the wavelength. Thus, if the protective layer 150 is thicker than the wavelength, no light reaches the periodic structure 120. As a result, there is no quasi-guided mode, and the function of outputting light in a particular direction cannot be achieved. If the protective layer 150 has a refractive index higher than or similar to that of the photoluminescent layer 110, the light reaches the interior of the protective layer 150; therefore, there is no limitation on the thickness of the protective layer 150. Nevertheless, a thinner protective layer 150 is desirable because more light is output if most of the portion in which light is guided (this portion is hereinafter referred to as "waveguide layer") is made of a photoluminescent material. The protective layer 150 may be made of the same material as the periodic structure (light-transmissive layer) 120. In this case, the light-transmissive layer 120 having the periodic structure functions as a protective layer. The light-transmissive layer 120 desirably has a lower refractive index than the photoluminescent layer 110.

6. Material and Method of Manufacture

Directional light emission can be achieved if the photoluminescent layer (or waveguide layer) and the periodic structure are made of materials that satisfy the above conditions. The periodic structure may be made of any material. However, a photoluminescent layer (or waveguide layer) or a periodic structure made of a medium with high light absorption is less effective in confining light and therefore results in a lower peak intensity and Q value. Thus, the photoluminescent layer (or waveguide layer) and the periodic structure may be made of media with relatively low light absorption.

For example, the periodic structure may be made of a dielectric with low light absorption. Examples of candidate materials for the periodic structure include magnesium fluoride ($MgF_2$), lithium fluoride (LiF), calcium fluoride ($CaF_2$), quartz ($SiO_2$), glasses, resins, magnesium oxide (MgO), indium tin oxide (ITO), titanium oxide ($TiO_2$), silicon nitride (SiN), tantalum pentaoxide ($Ta_2O_5$), zirconia ($ZrO_2$), zinc selenide (ZnSe), and zinc sulfide (ZnS). To form a periodic structure having a lower refractive index than the photoluminescent layer, as described above, $MgF_2$, LiF, $CaF_2$, $SiO_2$, glasses, and resins are desirably used, which have refractive indices of about 1.3 to 1.5.

The term "photoluminescent material" encompasses fluorescent materials and phosphorescent materials in a narrow sense, encompasses inorganic materials and organic materials (e.g., dyes), and encompasses quantum dots (i.e., tiny semiconductor particles). In general, a fluorescent material containing an inorganic host material tends to have a higher refractive index. Examples of fluorescent materials that emit blue light include $M_{10}(PO_4)_6Cl_2:Eu^{2+}$ (where M is at least one element selected from Ba, Sr, and Ca), $BaMgAl_{10}O_{17}:Eu^{2+}$, $M_3MgSi_2O_8:Eu^{2+}$ (where M is at least one element selected from Ba, Sr, and Ca), and $M_5SiO_4Cl_6:Eu^{2+}$ (where M is at least one element selected from Ba, Sr, and Ca). Examples of fluorescent materials that emit green light include $M_2MgSi_2O_7:Eu^{2+}$ (where M is at least one element selected from Ba, Sr, and Ca), $SrSi_5AlO_2N_7:Eu^{2+}$, $SrSi_2O_2N_2:Eu^{2+}$, $BaAl_2O_4:Eu^{2+}$, $BaZrSi_3O_9:Eu^{2+}$, $M_2SiO_4:Eu^{2+}$ (where M is at least one element selected from Ba, Sr, and Ca), $BaSi_3O_4N_2:Eu^{2+}$, $Ca_8Mg(SiO_4)_4Cl_2:Eu^{2+}$, $Ca_3SiO_4Cl_2:Eu^{2+}$, $CaSi_{12-(m+n)}Al_{(m+n)}O_nN_{16-n}:Ce^{3+}$, and β-SiAlON:$Eu^{2+}$. Examples of fluorescent materials that emit red light include $CaAlSiN_3:Eu^{2+}$, $SrAlSi_4O_7:Eu^{2+}$, $M_2Si_5N_8:Eu^{2+}$ (where M is at least one element selected from Ba, Sr, and Ca), $MSiN_2:Eu^{2+}$ (where M is at least one element selected from Ba, Sr, and Ca), $MSi_2O_2N_2:Yb^{2+}$ (where M is at least one element selected from Sr and Ca), $Y_2O_2S:Eu^{3+}$, $Sm^{3+}$, $La_2O_2S:Eu^{3+}$, $Sm^{3+}$, $CaWO_4:Li^{1+}$, $Eu^{3+}$, $Sm^{3+}$, $M_2SiS_4:Eu^{2+}$ (where M is at least one element selected from Ba, Sr, and Ca), and $M_3SiO_5:Eu^{2+}$ (where M is at least one element selected from Ba, Sr, and Ca). Examples of fluorescent materials that emit yellow light include $Y_3Al_5O_{12}:Ce^{3+}$, $CaSi_2O_2N_2:Eu^{2+}$, $Ca_3Sc_2Si_3O_{12}:Ce^{3+}$, $CaSc_2O_4:Ce^{3+}$, α-SiAlON:$Eu^{2+}$, $MSi_2O_2N_2:Eu^{2+}$ (where M is at least one element selected from Ba, Sr, and Ca), and $M_7(SiO_3)_6Cl_2:Eu^{2+}$ (where M is at least one element selected from Ba, Sr, and Ca).

Examples of quantum dots include materials such as CdS, CdSe, core-shell CdSe/ZnS, and alloy CdSSe/ZnS. Light of various wavelengths can be emitted depending on the material. Examples of matrices for quantum dots include glasses and resins.

The transparent substrate 140, as shown in, for example, FIGS. 1C and 1D, is made of a light-transmissive material having a lower refractive index than the photoluminescent layer 110. Examples of such materials include $MgF_2$, LiF, $CaF_2$, $SiO_2$, glasses, and resins.

Example methods of manufacture will now be described.

Figure 24:
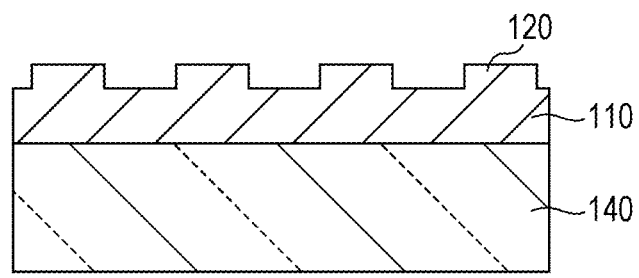
FIG. 24 is an example where the periodic structure is formed by partially processing the photoluminescent layer.

An example method for manufacturing the structure shown in FIGS. 1C and 1D includes depositing a thin film of fluorescent material on the transparent substrate 140 by a process such as evaporation, sputtering, or coating to form the photoluminescent layer 110 and then depositing a dielectric and patterning it by a process such as photolithography to form the periodic structure 120. Alternatively, the periodic structure 120 may be formed by nanoimprinting. As shown in FIG. 24, the periodic structure 120 may also be formed by partially processing the photoluminescent layer 110. In this case, the periodic structure 120 is made of the same material as the photoluminescent layer 110.

The light-emitting device 100 shown in FIGS. 1A and 1B can be manufactured, for example, by fabricating the light-emitting device 100a shown in FIGS. 1C and 1D and then stripping the photoluminescent layer 110 and the periodic structure 120 from the substrate 140.

The structure shown in FIG. 19A can be manufactured, for example, by forming the periodic structure 120a on the transparent substrate 140 by a process such as a semiconductor process or nanoimprinting and then depositing thereon the material for the photoluminescent layer 110 by a process such as evaporation or sputtering. The structure shown in FIG. 19B can be manufactured by filling the recesses in the periodic structure 120a with the photoluminescent layer 110 by a process such as coating.

The above methods of manufacture are for illustrative purposes only, and the light-emitting devices according to the embodiments of the present disclosure may be manufactured by other methods.

Examples

Light-emitting devices according to embodiments of the present disclosure are illustrated by the following examples.

A sample light-emitting device having the same structure as in FIG. 19A was fabricated and evaluated for its properties. The light-emitting device was fabricated as follows.

Figure 25:
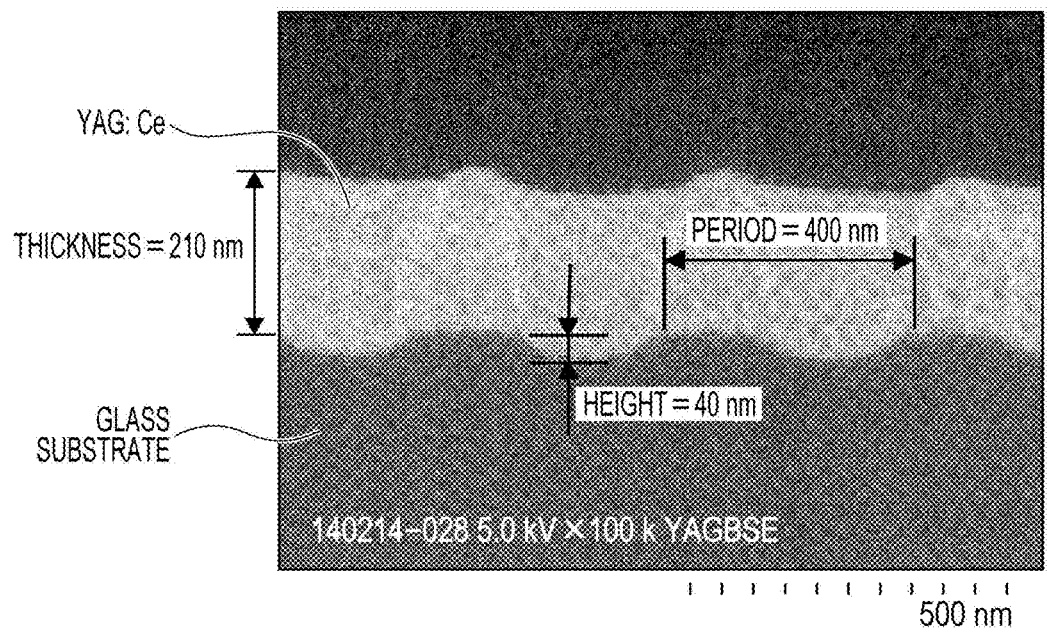
FIG. 25 is a cross-sectional transmission electron microscopy (TEM) image of a photoluminescent layer formed on a glass substrate having a periodic structure.
Figure 26:
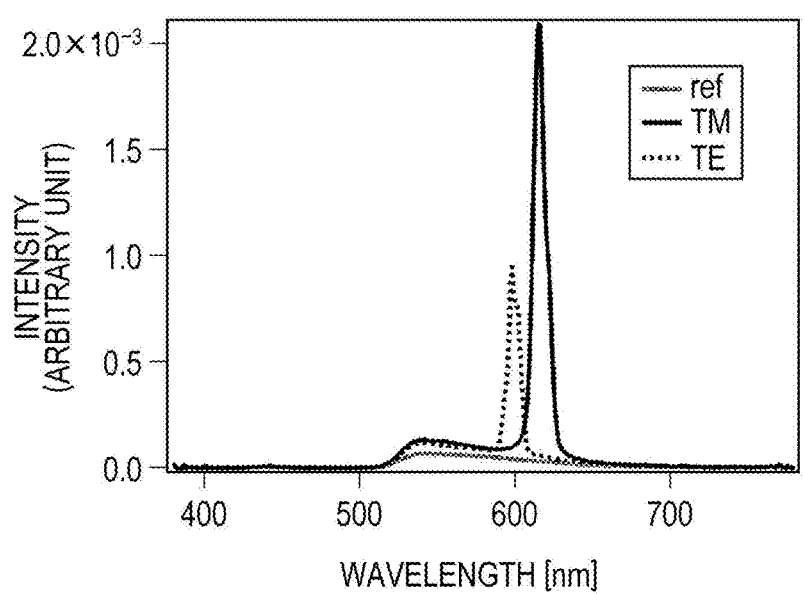
FIG. 26 is a graph showing the results of measurements of the spectrum of light output from a sample light-emitting device in the front direction.

A one-dimensional periodic structure (stripe-shaped projections) having a period of 400 nm and a height of 40 nm was formed on a glass substrate, and a photoluminescent material, i.e., YAG:Ce, was deposited thereon to a thickness of 210 nm. FIG. 25 shows a cross-sectional transmission electron microscopy (TEM) image of the resulting light-emitting device. FIG. 26 shows the results of measurements of the spectrum of light output from the light-emitting device in the front direction when YAG:Ce was excited with an LED having an emission wavelength of 450 nm. FIG. 26 shows the results (ref) for a light-emitting device including no periodic structure, the results for the TM mode, and the results for the TE mode. The TM mode has a polarization component parallel to the one-dimensional periodic structure. The TE mode has a polarization component perpendicular to the one-dimensional periodic structure. The results show that the intensity of light of a particular wavelength in the case with the periodic structure is significantly higher than without a periodic structure. The results also show that the light enhancement effect is greater for the TM mode, which has a polarization component parallel to the one-dimensional periodic structure.

Figure 27A:
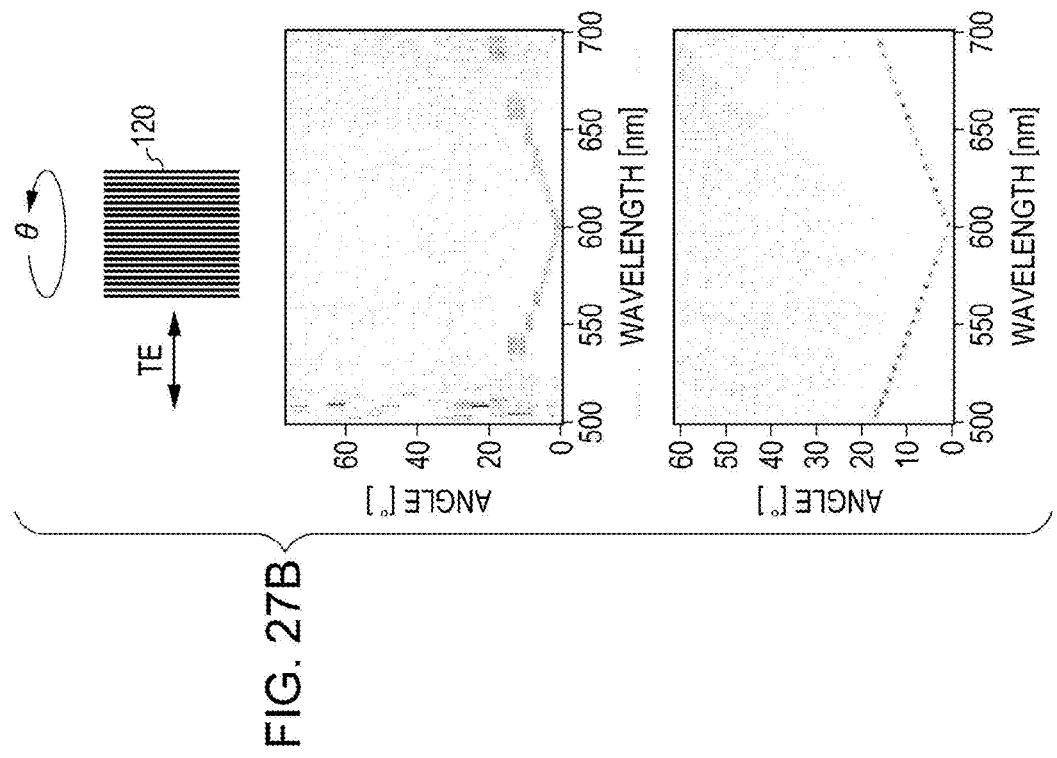
FIGS. 27A and 27B are graphs showing the results of measurements (top) and calculations (bottom) of the angular dependence of light output from the sample light-emitting device.
Figure 27B:
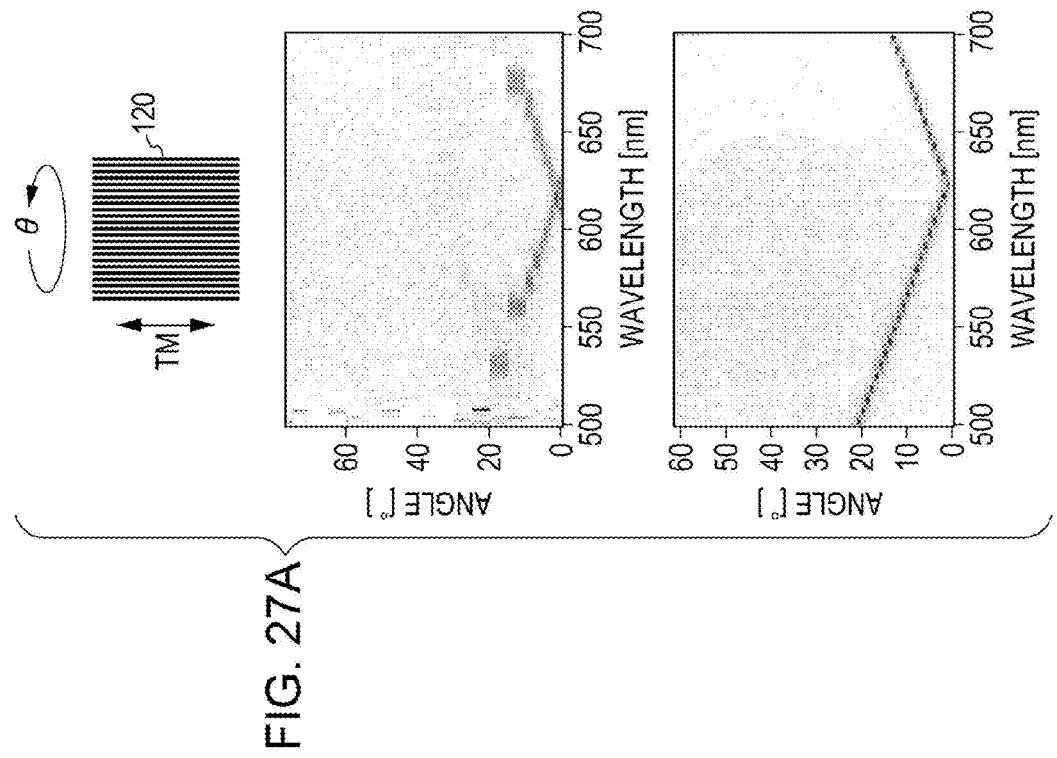
Figure 28A:
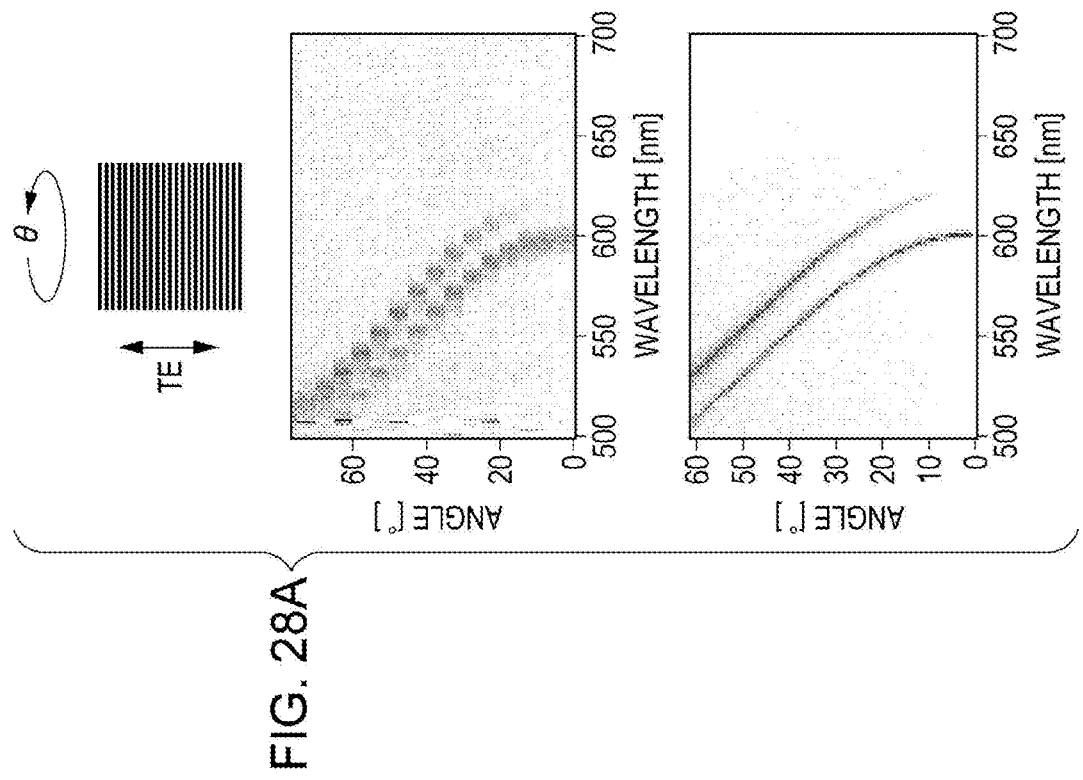
FIGS. 28A and 28B are graphs showing the results of measurements (top) and calculations (bottom) of the angular dependence of the light output from the sample light-emitting device.
Figure 28B:
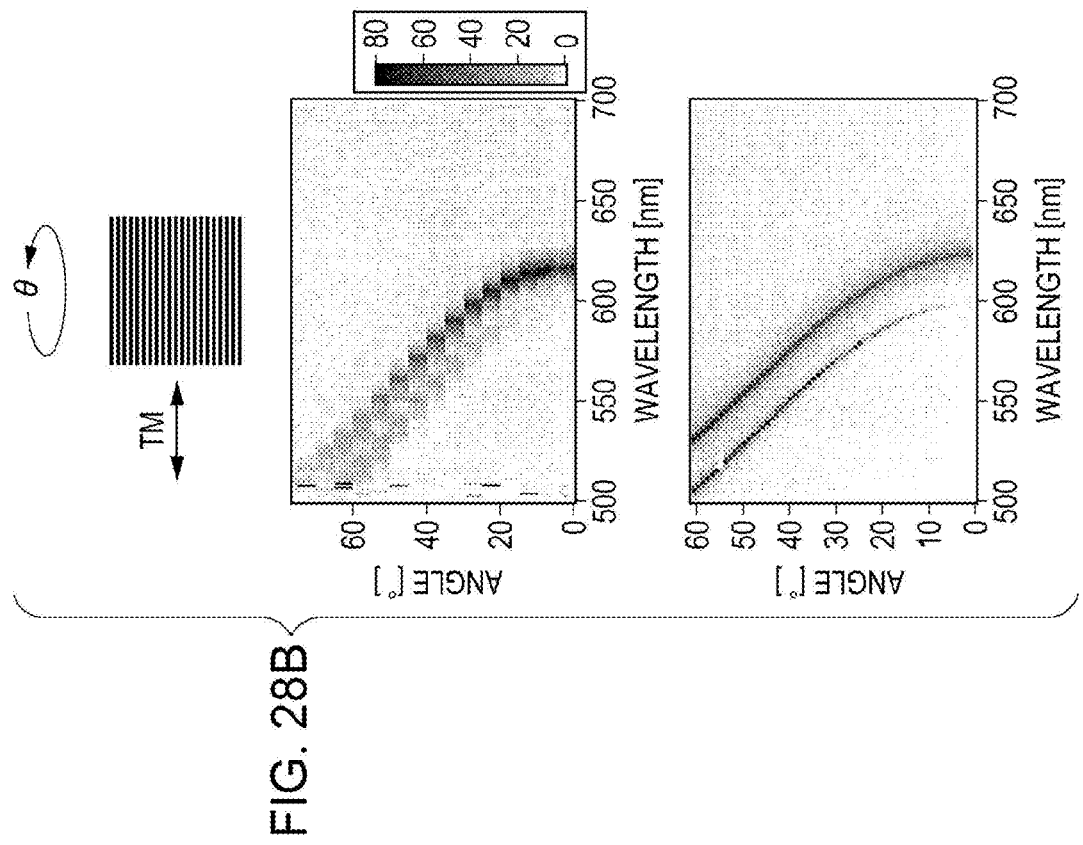

FIGS. 27A, 27B, 28A, and 28B show the results of measurements and calculations of the angular dependence of the intensity of light output from the same sample. FIGS. 27A and 27B show the results of measurements (top) and calculations (bottom) for rotation about an axis parallel to the line direction of the one-dimensional periodic structure (i.e., the periodic structure 120). FIGS. 28A and 28B show the results of measurements (top) and calculations (bottom) for rotation about an axis perpendicular to the line direction of the one-dimensional periodic structure (i.e., the periodic structure 120). FIGS. 27A, 27B, 28A, and 28B show the results for linearly polarized light in the TM mode and the TE mode. FIG. 27A shows the results for linearly polarized light in the TM mode. FIG. 27B shows the results for linearly polarized light in the TE mode. FIG. 28A shows the results for linearly polarized light in the TE mode. FIG. 28B shows the results for linearly polarized light in the TM mode. As can be seen from FIGS. 27A, 27B, 28A, and 28B, the enhancement effect is greater for the TM mode, and the enhanced wavelength shifts with angle. For example, light of a wavelength of 610 nm is observed only in the TM mode and in the front direction, indicating that the light is directional and polarized. In addition, the top and bottom parts of each figure match each other. Thus, the validity of the above calculations was experimentally demonstrated.

Figure 29:
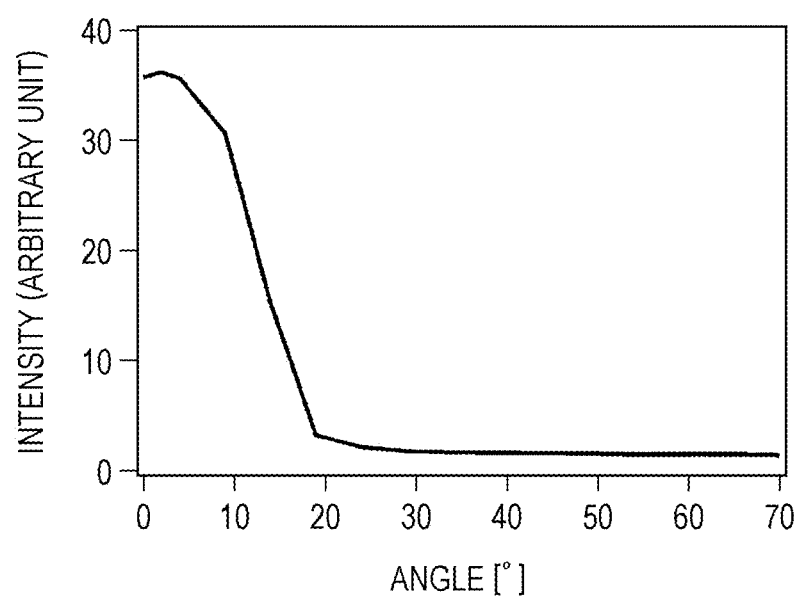
FIG. 29 is a graph showing the results of measurements of the angular dependence of light (wavelength: 610 nm) output from the sample light-emitting device.

Among the above results of measurements, for example, FIG. 29 shows the angular dependence of the intensity of light of a wavelength of 610 nm for rotation about an axis perpendicular to the line direction. As shown in FIG. 29, the light was significantly enhanced in the front direction and was little enhanced at other angles. The angle of directionality of the light output in the front direction is less than 15°. The angle of directionality is the angle at which the intensity is 50% of the maximum intensity and is expressed as the angle of one side with respect to the direction with the maximum intensity. This demonstrates that directional light emission was achieved. In addition, all the light was the TM mode, which demonstrates that polarized light emission was simultaneously achieved.

Although YAG:Ce, which emits light in a wide wavelength range, was used in the above experiment, directional and polarized light emission can also be achieved using a similar structure including a photoluminescent material that emits light in a narrow wavelength range. Such a photoluminescent material does not emit light of other wavelengths and can therefore be used to provide a light source that does not emit light in other directions or in other polarized states.

7. Embodiment Including Reflectors on or Near Side Surfaces of Photoluminescent Layer An embodiment including reflectors on or near the side surfaces of a photoluminescent layer that forms a waveguide will now be described.

Figure 31:
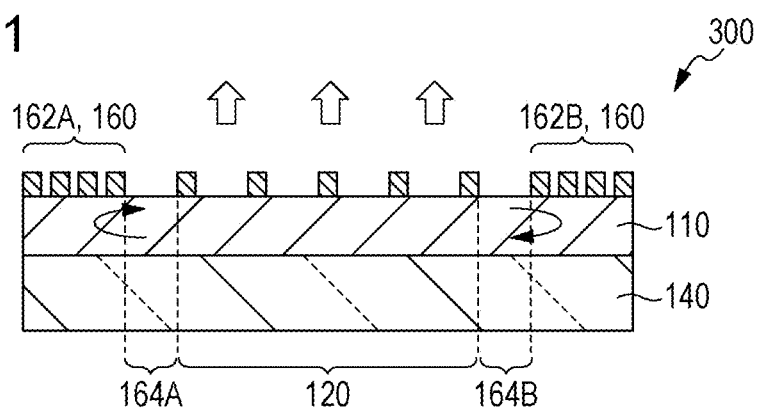
FIG. 31 is a sectional view of an example where distributed Bragg reflectors (DBRs) are located at both ends of the photoluminescent layer.

FIG. 31 is a sectional view of a light-emitting device 300 according to this embodiment. As in other embodiments, the light-emitting device 300 includes a photoluminescent layer 110 and a light-transmissive layer including a periodic structure 120 located on or near the photoluminescent layer 110. That is, a submicron structure is defined on the light-transmissive layer. Light (e.g., fluorescence) emitted from the photoluminescent layer 110 in response to excitation light is coupled into a particular quasi-guided mode determined by the periodic structure 120. The light coupled into the quasi-guided mode is output from the photoluminescent layer 110 through the periodic structure 120 as propagating light having high directionality in a particular direction.

As shown in FIG. 31, the light-emitting device 300 includes reflectors 160 on or near the side surfaces of the photoluminescent layer 110. The reflectors 160 are intended to reflect light leaking from the side surfaces of the photoluminescent layer 110 back into the photoluminescent layer 110. The reflectors 160 are located outside the periodic structure 120 as viewed in the direction normal to the photoluminescent layer 110.

An example where distributed Bragg reflectors (DBRs) 162 are used as the reflectors 160 will now be described. If DBRs are used as the reflectors 160, they exhibit relatively low light absorption.

The positions where the DBRs 162 are located on the photoluminescent layer 110 will be described first. The periodic structure 120 located on or near the photoluminescent layer 110 has a period in a particular direction. For example, the periodic structure 120 shown in FIGS. 1A and 1B, which includes stripe-shaped projections, has a period in the particular direction in which the projections are arranged (i.e., the x direction). A first DBR 162A is located on or near one side surface of the photoluminescent layer 110 in the particular direction. A second DBR 162B is located on or near the other side surface of the photoluminescent layer 110 in the particular direction. The first DBR 162A and the second DBR 162B are arranged with the periodic structure 120 therebetween in the particular direction defined by the periodic structure 120.

The first DBR 162A and the second DBR 162B each include a diffraction grating. These diffraction gratings may be located, for example, in the same layer or substantially in the same plane as the periodic structure (light-transmissive layer) 120. The period of the diffraction gratings may be determined depending on the wavelength to be reflected. The period of the periodic structure 120 determines the wavelength of the light guided in the photoluminescent layer 110. For example, if the period of the DBRs 162A and 162B is one-half the period of the periodic structure 120, the DBRs 162A and 162B can selectively reflect light of the above wavelength.

The diffraction gratings of the first DBR 162A and the second DBR 162B (which may be collectively referred to as "DBRs 162") can be fabricated, for example, by the same process using the same material as the periodic structure 120. This simplifies the manufacturing process. For example, as shown in FIG. 24, if the periodic structure 120 is directly formed on the photoluminescent layer 110, the diffraction gratings of the DBRs 162 may also be directly formed on the photoluminescent layer 110. However, the diffraction gratings of the DBRs 162 may be fabricated using any dielectric or metal material different from the material for the periodic structure 120.

Light propagating through the photoluminescent layer 110 (i.e., light emitted in response to excitation light, or the excitation light itself) is partially reflected by the first DBR 162A and/or the second DBR 162B. The light reflected by the first DBR 162A propagates through the photoluminescent layer 110 and is at least partially reflected by the second DBR 162B. Likewise, the light reflected by the second DBR 162B propagates through the photoluminescent layer 110 and is at least partially reflected by the first DBR 162A. Thus, the photoluminescent layer 110, the first DBR 162A, and the second DBR 162B can function together as a resonator.

In this structure, light propagating outside the periodic structure 120 without being converted into directional light is reflected back into the periodic structure 120 by the first DBR 162A and/or the second DBR 162B so that more light is guided in the photoluminescent layer 110. Accordingly, more light is coupled into a quasi-guided mode in the photoluminescent layer 110 so that more directional light can be output from the photoluminescent layer 110.

If the DBRs 162 are used, the distance between the first DBR 162A and the second DBR 162B may be set so as to confine light of the wavelength corresponding to a particular output direction to improve the angular dependence of the emission wavelength.

An example structure of a grating coupler including the first DBR 162A or the second DBR 162B is disclosed in Japanese Unexamined Patent Application Publication No. 2009-288718, the entire content of which is incorporated herein by reference.

The light-emitting device 300 further includes a first phase-matching element 164A between the first DBR 162A and the periodic structure 120 and a second phase-matching element 164B between the second DBR 162B and the periodic structure 120. The first phase-matching element 164A and the second phase-matching element 164B (which may be collectively referred to as "phase-matching elements 164") include no periodic structure.

The length of the phase-matching elements 164 may be appropriately set so that the light reflected by the DBRs 162 is in phase with the light in the quasi-guided mode. This allows in-phase light to be added to amplify the light in the quasi-guided mode, thus improving the output efficiency. For example, the length of the phase-matching elements 164 may be set to one-eighth the period of the periodic structure of the light-transmissive layer 120. The distance between the first DBR 162A and the second DBR 162B may be appropriately set so that the light reflected by one DBR 162 is in phase with the light reflected by the other DBR 162.

An example where reflective surfaces 166R are formed using a metal material instead of providing the DBRs 162 as the reflectors 160, as described above, will now be described. A structure including reflective surfaces formed using a metal material is advantageous over a structure including DBRs. By using the structure including the reflective surfaces, smaller reflectors can be designed.

Figure 32:
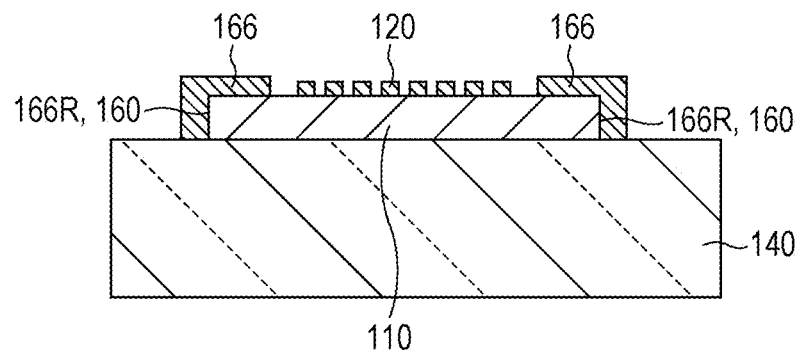
FIG. 32 is a sectional view of an example where reflective metal surfaces are located at both ends of the photoluminescent layer.

FIG. 32 shows an example where metal films 166 cover the end surfaces of the photoluminescent layer 110 located on the transparent substrate 140. The metal films 166 form reflective metal surfaces 166R on both end surfaces of the photoluminescent layer 110. As in the above example including the DBRs 162, this structure prevents light from escaping from the end surfaces of the photoluminescent layer 110 so that more light propagates through the photoluminescent layer 110.

If the reflective metal surfaces 166R are provided, as shown in FIG. 32, excitation light may be directed into the back or front surface of the photoluminescent layer 110, for example, as shown in FIGS. 16, 17A, and 17B. Alternatively, the reflective metal surfaces 166R may be provided only in portions of the end surfaces of the photoluminescent layer 110, and excitation light may be directed into the region not covered by the reflective metal surfaces 166R.

As shown in FIG. 32, the metal films 166 may not only cover the end surfaces 110, but also partially cover the edges of the top surface of the photoluminescent layer 110. Such metal films 166 are easier to form than metal films covering only the end surfaces 110. The reflective metal surfaces 166R are not necessarily formed by films (i.e., the metal films 166), but may be formed, for example, by bulk metal.

In the example including the reflective metal surfaces 166R, phase-matching layers may be provided between the periodic structure 120 and the reflective metal surfaces 166R. This allows light to be readily coupled into the quasi-guided mode defined by the periodic structure 120.

The DBRs 162 and the reflective metal surfaces 166R may be used in combination. For example, the first DBR 162A may be used in combination with a reflective metal surface 166R, rather than the second DBR 162B. In this case, a structure can be employed in which excitation light is directed into the photoluminescent layer 110 through the first DBR 162A. For this structure, for example, as shown in FIG. 16, excitation light may be directed into the back or front surface of the photoluminescent layer 110. Alternatively, the reflective metal surfaces 166R may be provided on both end surfaces of the photoluminescent layer 110 in addition to the first DBR 162A and the second DBR 162B.

Various examples in which a pair of reflectors 162 are provided with the periodic structure 120 therebetween will now be described with reference to FIGS. 33A to 33D.

Figure 33A:
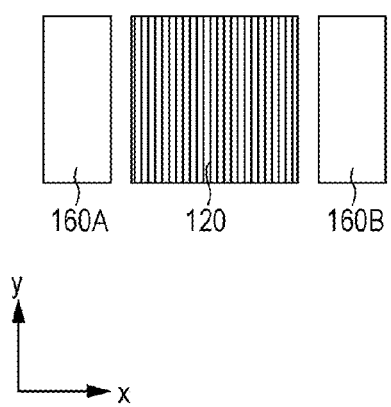
FIGS. 33A to 33D are schematic plan views of various examples where reflectors are located around the periodic structure.

FIG. 33A shows an example where the periodic structure 120 includes stripe-shaped projections and has a period in one dimension, i.e., only in the x direction. In this case, a quasi-guided mode is expected to form only in the x direction. Thus, a pair of reflectors 160A and 160B may be arranged outside the periodic structure 120 in the x direction with the periodic structure 120 therebetween.

Figure 33B:
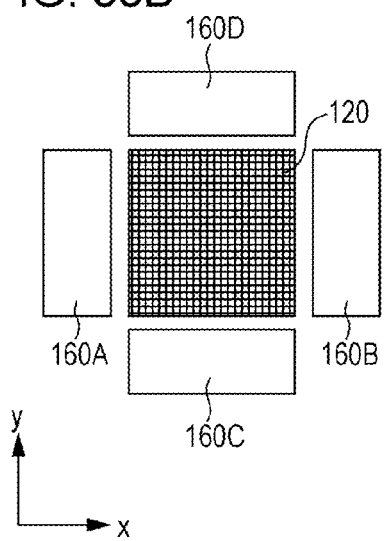

FIG. 33B shows an example where the periodic structure 120 includes dot-shaped projections arranged in the x direction and the y direction and has periods in two dimensions, i.e., in the x direction and the y direction. In this case, quasi-guided modes are expected to be formed in at least both of the x direction and the y direction. Thus, a pair of reflectors 160A and 160B may be arranged outside the periodic structure 120 in the x direction with the periodic structure 120 therebetween, and a pair of reflectors 160C and 160D may be arranged outside the periodic structure 120 in the y direction with the periodic structure 120 therebetween.

In the structure shown in FIG. 33B, quasi-guided modes can also be formed in oblique directions between the x direction and the y direction by the effect of the periodic structure 120. Thus, for example, a structure may be employed in which the dotted periodic structure 120 is located in an octagonal region in plan view and which further includes reflectors for coupling more light into the quasi-guided modes in the oblique directions.

Figure 33C:
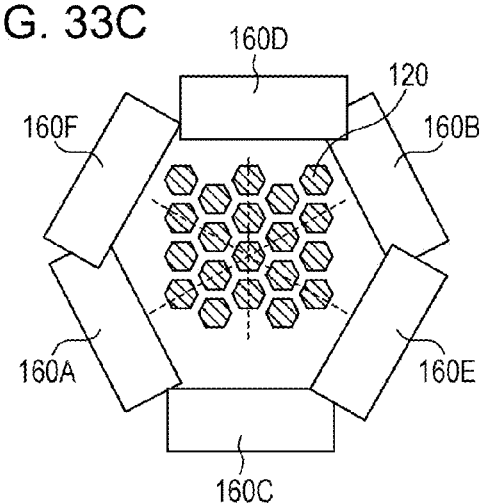

FIG. 33C shows an example where the periodic structure 120 includes projections having a hexagonal planar shape that are arranged regularly at intervals. This periodic structure 120 has a periodic pattern along three axes (in this example, three axes intersecting at angles of 60°), and quasi-guided modes are expected to form in the three axial directions. Thus, three pairs of reflectors (i.e., reflectors 160A and 160B, reflectors 160C and 160D, and reflectors 160E and 160F) may be provided for the three axes.

Figure 33D:
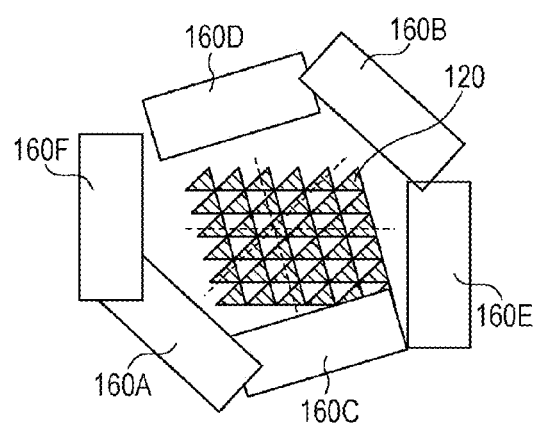

FIG. 33D shows an example where the periodic structure 120 includes projections and recesses having a triangular planar shape that are arranged regularly in a close-packed manner. This periodic structure 120 has a periodic pattern along three axes, and quasi-guided modes are expected to form in the three axial directions. Thus, three pairs of reflectors (i.e., reflectors 160A and 160B, reflectors 160C and 160D, and reflectors 160E and 160F) may be provided for the three axes.

Whereas the reflectors 160 in the examples illustrated above are provided on or near the side surfaces of the photoluminescent layer 110 to improve the output efficiency, the reflectors 160 may be provided to achieve other effects.

Figure 34A:
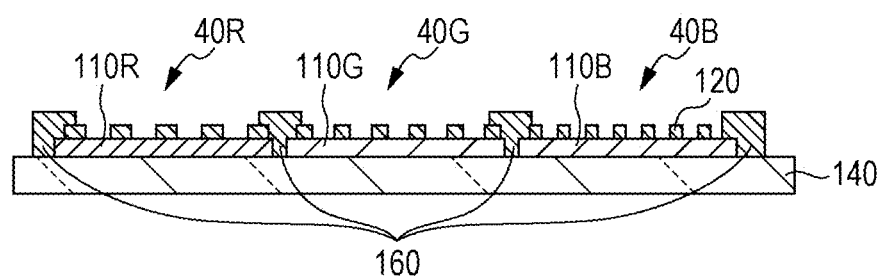
FIGS. 34A and 34B are a sectional view and a plan view, respectively, of an example where three light-emitting devices are tiled with reflectors therebetween.
Figure 34B:
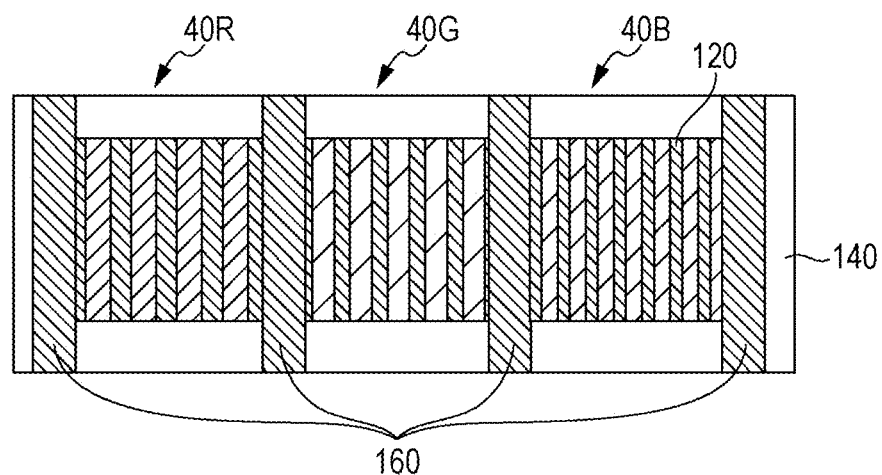

For example, as shown in FIGS. 34A and 34B, a structure may be employed in which light-emitting devices 40R, 40G, and 40B that emit light of different colors, i.e., red R, green G, and blue B, respectively, are arranged side by side without any space therebetween (i.e., tiled). The light-emitting devices 40R, 40G, and 40B include photoluminescent layers 110R, 110G, and 110B, respectively, located on a common substrate 140. In response to excitation light, the photoluminescent layer 110R emits red light, the photoluminescent layer 110G emits green light, and the photoluminescent layer 110B emits blue light. Periodic structures 120 are located on the photoluminescent layers 110R, 110G, and 110B. The period of each periodic structure 120 matches the emission wavelength so that it can efficiently output directional light of a particular wavelength. In this way, the light-emitting devices 40R, 40G, and 40B can output red, green, and blue light, respectively, thus outputting white light with high directionality.

In the light-emitting devices 40R, 40G, and 40B shown in FIGS. 34A and 34B, reflectors 160 (in this example, metal films) are located between the photoluminescent layers 110R, 110G, and 110B. Thus, the reflectors 160 may be provided on the side surfaces of the photoluminescent layers 110R, 110G, and 110B to prevent undesirable light (e.g., excitation light or fluorescence light from the adjacent devices) from entering the adjacent photoluminescent layers of other colors. This allows the light output from each light-emitting device to be controlled so that the desired white light can be readily output with high directionality.

Figure 35:
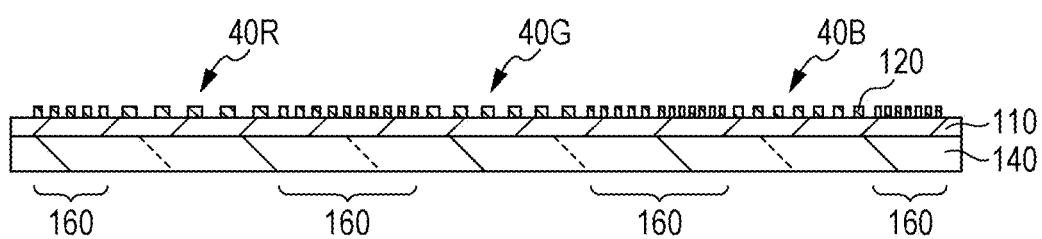
FIG. 35 is a sectional view of an example where light-emitting devices are located adjacent to each other with DBRs serving as reflectors therebetween.

FIG. 35 shows an example where light-emitting devices 40R, 40G, and 40B that output red, green, and blue light, respectively, are located adjacent to each other with DBRs serving as reflectors 160 therebetween. The light-emitting devices 40R, 40G, and 40B include a photoluminescent layer 110 formed on a common substrate 140. In the example shown in FIG. 35, the light-emitting devices 40R, 40G, and 40B share the photoluminescent layer 110.

Each of the light-emitting devices 40R, 40G, and 40B includes a periodic structure 120 on the photoluminescent layer 110. The periodic structures 120 of the light-emitting devices 40R, 40G, and 40B have different periods. With this structure, light of a particular wavelength (i.e. color) can be selectively output from each light-emitting device with high directionality by the effect of the periodic structure 120.

The DBRs located outside the periodic structures 120 each include a diffraction grating. The period of the diffraction grating is set so as to selectively reflect light of the emission wavelength determined by the periodic structure 120. Thus, light of a particular wavelength can be output from each of the light-emitting devices 40R, 40G, and 40B with improved output efficiency.

In one embodiment, the submicron structure may include at least one periodic structure defined by at least the projections or recesses, and the at least one periodic structure may include a first periodic structure satisfying the following relationship:

$$\lambda_a/n_{wav-a} < p_a < \lambda_a$$

where $p_a$ is the period of the first periodic structure.

The light-emitting devices according to the embodiments of the present disclosure, which can be used to provide directional light-emitting apparatuses, are applicable to, for example, optical devices such as lighting fixtures, displays, and projectors.

What is claimed is:

1. A light-emitting device comprising:
   a photoluminescent layer that has a first surface perpendicular to a thickness direction thereof and emits light containing first light, an area of the first surface being larger than a sectional area of the photoluminescent layer perpendicular to the first surface;
   a light-transmissive layer located on the photoluminescent layer; and
   one or more reflectors that are located directly on at least one of the photoluminescent layer and the light-transmissive layer, and at least partially surround the submicron structure, wherein
   at least one of the photoluminescent layer and the light-transmissive layer has a submicron structure comprising at least projections or recesses arranged perpendicular to a thickness direction of the photoluminescent layer,
   at least one of the photoluminescent layer and the light-transmissive layer has a light emitting surface perpendicular to the thickness direction of the photoluminescent layer, the first light being emitted from the light emitting surface,
   the submicron structure satisfies the following relationship:

$$\lambda_a/n_{wav-a} < D_{int} < \lambda_a$$

where $D_{int}$ is a center-to-center distance between adjacent projections or recesses, $\lambda_a$ is the wavelength of the first light in air, and $n_{wav-a}$ is the refractive index of the photoluminescent layer for the first light, and
   a thickness of the photoluminescent layer, the refractive index of the photoluminescent layer and the center-to-center distance are set to limit a directional angle of the first light emitted from the light emitting surface.

2. The light-emitting device according to claim 1, wherein the one or more reflectors include at least one reflector comprising a reflective metal surface located on an end surface of the photoluminescent layer.

3. The light-emitting device according to claim 2, further comprising a phase-matching element between the submicron structure and the reflective metal surface.

4. The light-emitting device according to claim 1, wherein the one or more reflectors include at least one pair of reflectors that are arranged in a direction of a periodic pattern of the submicron structure in such a way that the submicron structure is located between the pair of reflectors.

5. A light-emitting apparatus comprising:
   the light-emitting device according to claim 1; and
   a light source that directs excitation light into the light-emitting device.

6. A light-emitting device according to claim 1, wherein the photoluminescent layer includes a phosphor.

7. The light-emitting device according to claim 1, wherein 380 nm≤λa≤780 nm is satisfied.

8. The light-emitting device according to claim 1, wherein the thickness of the photoluminescent layer, the refractive index of the photoluminescent layer and the center-to-center distance are set to allow an electric field to be formed in the photoluminescent layer, in which antinodes of the electric field are located in areas, the areas each corresponding to respective one of the projections and/or recesses.

9. The light-emitting device according to claim 1, wherein the light-transmissive layer is located indirectly on the photoluminescent layer.

10. The light-emitting device according to claim 1, wherein the directional angle is limited less than 15 degrees.

11. The light-emitting apparatus according to claim 1, further comprising a substrate that has refractive index $n_{s-a}$ for the first light and is located on the photoluminescent layer, wherein $\lambda_a/n_{wav-a} < p_a < \lambda_a/n_{s-a}$ is satisfied.

12. The light-emitting device according to claim 1, wherein the thickness of the photoluminescent layer, the refractive index of the photoluminescent layer and the center-to-center distance are set to allow an electric field to be formed in the photoluminescent layer, in which antinodes of the electric field are located at, or adjacent to, at least the projections or recesses.

13. A light-emitting device comprising:
a photoluminescent layer that has a first surface perpendicular to a thickness direction thereof and emits light containing first light, an area of the first surface being larger than a sectional area of the photoluminescent layer perpendicular to the first surface;
a light-transmissive layer having a higher refractive index than the photoluminescent layer; and
one or more reflectors that are located directly on at least one of the photoluminescent layer and the light-transmissive layer, and at least partially surround the submicron structure, wherein
the light-transmissive layer has a submicron structure comprising a periodic structure having at least projections or recesses arranged perpendicular to a thickness direction,
at least one of the photoluminescent layer and the light-transmissive layer has a light emitting surface perpendicular to the thickness direction of the photoluminescent layer, the first light being emitted from the light emitting surface,
the periodic structure satisfies the following relationship:

$$\lambda_a/n_{wav-a} < p_a < \lambda_a$$

where $p_a$ is the period of the periodic structure, $\lambda_a$ is the wavelength of the first light in air, and $n_{wav-a}$ is the refractive index of the photoluminescent layer for the first light, and
a thickness of the photoluminescent layer, the refractive index of the photoluminescent layer and the period of the periodic structure are set to limit a directional angle of the first light emitted from the light emitting surface.

14. The light-emitting device according to claim 13, wherein a distance between the submicron structure and the photoluminescent layer is more than $\lambda a/2$.

15. A light-emitting device comprising:
a light-transmissive layer having a submicron structure; a photoluminescent layer that has a first surface perpendicular to a thickness direction thereof and is located on the submicron structure and emits light containing first light; and
one or more reflectors that are located directly on the light-transmissive layer and, at least partially surround the submicron structure, wherein
at least one of the photoluminescent layer and the light-transmissive layer has a light emitting surface perpendicular to the thickness direction of the photoluminescent layer, the first light being emitted from the light emitting surface, the submicron structure comprises a periodic structure having at least projections or recesses arranged perpendicular to the thickness direction,
the periodic structure satisfies the following relationship:

$$\lambda_a/n_{wav-a} < p_a < \lambda_a$$

where $p_a$ is the period of the periodic structure, $\lambda_a$ is the wavelength of the first light in air, and $n_{wav-a}$ is the refractive index of the photoluminescent layer for the first light, and
a thickness of the photoluminescent layer, the refractive index of the photoluminescent layer and the period of the periodic structure are set to limit a directional angle of the first light emitted from the light emitting surface.

16. A light-emitting device comprising:
a photoluminescent layer that has a first surface perpendicular to a thickness direction thereof and emits light containing first light, an area of the first surface being larger than a sectional area of the photoluminescent layer perpendicular to the first surface; and
one or more reflectors that are located directly on the photoluminescent layer, and at least partially surround the submicron structure, wherein
the photoluminescent layer has a submicron structure comprising a periodic structure having at least projections or recesses arranged perpendicular to a thickness direction of the photoluminescent layer,
the photoluminescent layer has a light emitting surface perpendicular to the thickness direction of the photoluminescent layer, the first light being emitted from the light emitting surface,
the periodic structure satisfies the following relationship:

$$\lambda_a/n_{wav-a} < p_a < \lambda_a$$

where $p_a$ is the period of the periodic structure, $\lambda_a$ is the wavelength of the first light in air, and $n_{wav-a}$ is the refractive index of the photoluminescent layer for the first light, and
a thickness of the photoluminescent layer, the refractive index of the photoluminescent layer and the period of the periodic structure are set to limit a directional angle of the first light emitted from the light emitting surface.

17. A light-emitting device comprising:
a photoluminescent layer that has a first surface perpendicular to a thickness direction thereof and emits light containing first light, an area of the first surface being larger than a sectional area of the photoluminescent layer perpendicular to the first surface; and
a light-transmissive layer that is located on the photoluminescent layer, wherein
at least one of the photoluminescent layer and the light-transmissive layer has a submicron structure comprising at least projections or recesses arranged perpendicular to a thickness direction of the photoluminescent layer, and one or more distributed Bragg reflectors comprising at least projections or recesses arranged perpendicular to the thickness direction of the photoluminescent layer,
the one or more distributed Bragg reflectors at least partially surround the submicron structure,
at least one of the photoluminescent layer and the light-transmissive layer has a light emitting surface perpendicular to the thickness direction of the photoluminescent layer, the first light being emitted from the light emitting surface, and
the submicron structure satisfies the following relationship:

$$\lambda_a/n_{wav-a} < D_{int} < \lambda_a$$

where $D_{int}$ is a center-to-center distance between adjacent projections or recesses, $\lambda_a$ is the wavelength of the first light in air, and $n_{wav-a}$ is the refractive index of the photoluminescent layer for the first light.

18. The light-emitting device according to claim 17, wherein
the submicron structure comprises a periodic structure including the projections or recesses of the submicron structure,
the distributed Bragg reflector comprises a diffraction grating including at least the projections or recesses of the distributed Bragg reflector,
the periodic structure of the submicron structure has a first period, and
the diffraction grating of the distributed Bragg reflector has a second period that is one-half the first period.

19. The light-emitting device according to claim 17, further comprising a phase-matching element between the submicron structure and the distributed Bragg reflector.

20. The light-emitting device according to claim 19, wherein the periodic structure has a first period, the phase-matching element having a length that is one-eighth the first period.

* * * * *